(12) United States Patent
Fujikura et al.

(10) Patent No.: US 12,378,694 B2
(45) Date of Patent: Aug. 5, 2025

(54) NITRIDE CRYSTAL, SEMICONDUCTOR LAMINATE, AND METHOD FOR MANUFACTURING NITRIDE CRYSTAL

(71) Applicant: SUMITOMO CHEMICAL COMPANY, LIMITED, Tokyo (JP)

(72) Inventors: Hajime Fujikura, Hitachi (JP); Takeshi Kimura, Hitachi (JP); Taichiro Konno, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 498 days.

(21) Appl. No.: 17/671,370

(22) Filed: Feb. 14, 2022

(65) Prior Publication Data
US 2022/0259765 A1  Aug. 18, 2022

(30) Foreign Application Priority Data
Feb. 15, 2021  (JP) .................... 2021-021522

(51) Int. Cl.
*C30B 29/18* (2006.01)
*C30B 25/18* (2006.01)
*C30B 29/38* (2006.01)

(52) U.S. Cl.
CPC .............. *C30B 29/38* (2013.01); *C30B 25/18* (2013.01)

(58) Field of Classification Search
CPC ..... C30B 29/38; C30B 29/403; C30B 29/406; C30B 25/18; C30B 25/02; C30B 25/10; C30B 25/14; C30B 25/16; C30B 25/186
See application file for complete search history.

(56) References Cited

U.S. PATENT DOCUMENTS

| | | |
|---|---|---|
| 2005/0011432 A1 | 1/2005 | Kitaoka et al. |
| 2007/0128753 A1 | 6/2007 | Oshima |
| 2012/0329245 A1 | 12/2012 | Uematsu et al. |
| 2019/0305090 A1 | 10/2019 | Tomita et al. |
| 2020/0031668 A1 | 1/2020 | Fujikura et al. |

(Continued)

FOREIGN PATENT DOCUMENTS

| | | |
|---|---|---|
| JP | 2005-039248 A | 2/2005 |
| JP | 2007-153664 A | 6/2007 |
| JP | 2012-246195 A | 12/2012 |

(Continued)

OTHER PUBLICATIONS

Honda et al., "Deep levels in n-GaN Doped with Carbon Studied by Deep Level and Minority Carrier Transient Spectroscopies," Japanese Journal of Applied Physics, vol. 51, 2012, pp. 04DF04-1 to 04DF04-4.

(Continued)

*Primary Examiner* — Matthew E. Hoban
*Assistant Examiner* — Lynne Edmondson
(74) *Attorney, Agent, or Firm* — Foley & Lardner LLP

(57) ABSTRACT

An object is to improve quality of a nitride crystal. A crystal represented by a composition formula $In_xAl_yGa_{1-x-y}N$ (satisfying $0 \leq x \leq 1$, $0 \leq y \leq 1$, and $0 \leq x+y \leq 1$), wherein the concentration of carbon in the crystal is less than $1 \times 10^{15}$ cm$^{-3}$, and the concentration of an electron trap E3 that exits in an energy range from 0.5 eV to 0.65 eV from a lower end of a conduction band in the crystal is less than $1 \times 10^{14}$ cm$^{-3}$.

10 Claims, 8 Drawing Sheets

(56) References Cited

U.S. PATENT DOCUMENTS

2022/0045177 A1* 2/2022 Horikiri .............. C23C 16/4488

FOREIGN PATENT DOCUMENTS

| JP | 2016-104693 A | 6/2016 |
| JP | 2019-186250 A | 10/2019 |
| JP | 2020-023427 A | 2/2020 |
| JP | 2020-035980 A | 3/2020 |

OTHER PUBLICATIONS

Kanegae et al., "Deep-level transient spectroscopy studies of electron and hole traps in n-type GaN homoepitaxial layers grown by quartz-free hydride-vapor-phase epitaxy," Applied Physics Letters, vol. 115, 2019, pp. 012103-1 to 012103-4.

Narita et al., "Why do electron traps at $E_c$-0.6 eV have inverse correlation with carbon concentrations in n-type GaN layers?" Japanese Journal of Applied Physics, vol. 59, 2020, pp. 105505-1 to 105505-6.

Shiojima et al., "Effect of Water Off-Angles on Detect Formation in Drift Layers Grown on Free-Standing GaN Substrates," Physica Status Solidi, 2019, 1900561, pp. 1-5.

Tanaka et al., "Deep-level transient spectroscopy of low-freecarrier-concentration n-GaN layers grown on freestanding GaN substrates: Dependence on carbon compensation ratio," Japanese Journal of Applied Physics, vol. 55, 2016, pp. 061101-1 to 061101-4.

Tokuda, Yutaka, "DLTS Studies of Defects in n-GaN," ECS Transactions, vol. 75, No. 4, 2016, pp. 39-49.

Zhang et al., "Probing unintentional Fe impurity incorporation in MOCVD homoepitaxy GaN: Toward GaN vertical power devices," Journal of Applied Physics, vol. 127, 2020, pp. 215707-1 to 215707-9.

ShinEtsu Quartz: A Joint Venture with Heraeus, "ShinEtsu quartz catalog", retrieved from the internet: https://www.sqp.co.jp/e/index.html on Aug. 8, 2024.

Toyo Tanso Carbon-Graphite Products, "Features of Special Graphite Products", retrieved from the internet: http://www.toyotanso.com on Aug. 8, 2024, pp. 9 and 13.

JP 2020-035980-A Google translation.

WO 2020/045172-A1 Google translation.

Office Action issued in corresponding Japanese Patent Application No. 2021-021522 dated Jun. 4, 2024 (6 pages).

* cited by examiner

NITRIDE CRYSTAL, SEMICONDUCTOR LAMINATE, AND METHOD FOR MANUFACTURING NITRIDE CRYSTAL

BACKGROUND OF THE INVENTION

1. Field of the Invention

The present invention relates to a nitride crystal, a semiconductor laminate, and a method for manufacturing a nitride crystal.

2. Description of Related Art

When manufacturing a semiconductor device such as a light emitting element or a high-speed transistor, for example, a crystal of group-III nitride such as gallium nitride (GaN) is sometimes used (see Patent Documents 1 to 4).

RELATED ART DOCUMENT

Patent Document

Patent Document 1: JP 2016-104693A
Patent Document 2: JP 2007-153664A
Patent Document 3: JP 2005-39248A
Patent Document 4: JP 2020-23427A

SUMMARY OF THE INVENTION

An object of the present invention is to improve quality of a nitride crystal.

According to an aspect of the present invention,
provided is a nitride crystal represented by a composition formula $In_xAl_yGa_{1-x-y}N$ (satisfying $0 \leq x \leq 1$, $0 \leq y \leq 1$, and $0 \leq x+y \leq 1$),
wherein the concentration of carbon in the crystal is less than $1 \times 10^{15}$ cm$^{-3}$, and
the concentration of an electron trap E3 that exists in an energy range from 0.5 eV to 0.65 eV from a lower end of a conduction band in the crystal is less than $1 \times 10^{14}$ cm$^{-3}$.

According to another aspect of the present invention, provided is a nitride crystal that is represented by a composition formula $In_xAl_yGa_{1-x-y}N$ (satisfying $0 \leq x \leq 1$, $0 \leq y \leq 1$, and $0 \leq x+y \leq 1$) and satisfies Expressions (1-1) and (1-2):

$$[E3] < 1 \times 10^{14} \quad (1\text{-}1)$$

$$[E3] \cdot [C]^2 \leq 1 \times 10^{43} \quad (1\text{-}2),$$

where [C] represents the concentration of carbon in the crystal expressed in the unit of cm$^{-3}$, and
[E3] represents the concentration of an electron trap E3 that exists in an energy range from 0.5 eV to 0.65 eV from a lower end of a conduction band in the crystal, the concentration of E3 being expressed in the unit of cm$^3$.

According to another aspect of the present invention, provided is a semiconductor laminate including:
a substrate; and
a nitride crystal layer that is provided on the substrate and is constituted by a crystal represented by a composition formula $In_xAl_yGa_{1-x-y}N$ (satisfying $0 \leq x \leq 1$, $0 \leq y \leq 1$, and $0 \leq x+y \leq 1$),
wherein the concentration of carbon in the nitride crystal layer is less than $1 \times 10^{15}$ cm$^{-3}$, and
the concentration of an electron trap E3 that exists in an energy range from 0.5 eV to 0.65 eV from a lower end of a conduction band in the crystal is less than $1 \times 10^{14}$ cm$^{-3}$.

According to another aspect of the present invention, provided is a semiconductor laminate including:
a substrate; and
a nitride crystal layer that is provided on the substrate and is constituted by a crystal represented by a composition formula $In_xAl_yGa_{1-x-y}N$ (satisfying $0 \leq x \leq 1$, $0 \leq y \leq 1$, and $0 \leq x+y \leq 1$),
wherein the nitride crystal layer satisfies Expressions (1-1) and (1-2):

$$[E3] < 1 \times 10^{14} \quad (1\text{-}1)$$

$$[E3] \cdot [C]^2 \leq 1 \times 10^{43} \quad (1\text{-}2),$$

where [C] represents the concentration of carbon in the nitride crystal layer expressed in the unit of cm$^{-3}$, and
[E3] represents the concentration of an electron trap E3 that exists in an energy range from 0.5 eV to 0.65 eV from a lower end of a conduction band in the crystal, the concentration of E3 being expressed in the unit of cm$^{-3}$.

According to another aspect of the present invention, provided is a method for manufacturing a nitride crystal, including:
a step of preparing a reaction vessel for accommodating a substrate; and
a step of epitaxially growing a nitride crystal represented by a composition formula $In_xAl_yGa_{1-x-y}N$ (satisfying $0 \leq x \leq 1$, $0 \leq y \leq 1$, and $0 \leq x+y \leq 1$) on the substrate by supplying a group-III element source gas and a nitrogen source gas to the substrate heated to a predetermined growth temperature in the reaction vessel,
wherein the step of preparing the reaction vessel includes:
a step of preparing, as the reaction vessel, a vessel that includes a high-temperature reaction region that is heated to the growth temperature and comes into contact with gas supplied to the substrate, and in which at least a portion of a surface of a member that forms the high-temperature reaction region includes a protective layer that is made of an iron cyano complex; and
a high temperature baking step of cleaning and modifying the surface of the member forming the high-temperature reaction region by supplying a hydrogen gas and a halogen-based gas into the reaction vessel while heating the high-temperature reaction region to a temperature of 1500° C. or more, without supplying the nitrogen source gas into the reaction vessel.

According to another aspect of the present invention, provided is an apparatus for manufacturing a nitride crystal, including:
a reaction vessel for accommodating a substrate;
a heating portion configured to heat at least the substrate in the reaction vessel;
a gas supply system configured to supply a group-III element source gas and a nitrogen source gas to the substrate in the reaction vessel; and
a controller configured to control the heating portion and the gas supply system to supply the group-III element source gas and the nitrogen source gas to the substrate heated to a predetermined growth temperature in the reaction vessel and epitaxially grow a nitride crystal represented by a composition formula $In_xAl_yGa_{1-x-y}N$ (satisfying $0 \leq x \leq 1$, $0 \leq y \leq 1$, and $0 \leq x+y \leq 1$) on the substrate, wherein the reaction vessel includes a high-temperature reaction region that is heated to the growth temperature and comes into contact with gas supplied to the substrate, at least a portion of a surface of a member that forms the high-temperature reaction region includes a protective layer that is made of an iron cyano complex, and before a treatment for epitaxially growing the nitride crystal, the controller performs a high temperature baking treatment for cleaning and modifying the surface of the member forming the high-temperature reaction region by supplying a hydrogen gas and a halogen-based gas into the reaction vessel while heating the high-temperature reaction region to a temperature of 1500° C. or more, without supplying the nitrogen source gas into the reaction vessel.

According to the present invention, quality of a nitride crystal can be improved.

DETAILED DESCRIPTION OF THE INVENTION

Findings of the Inventors

Figure 1A:
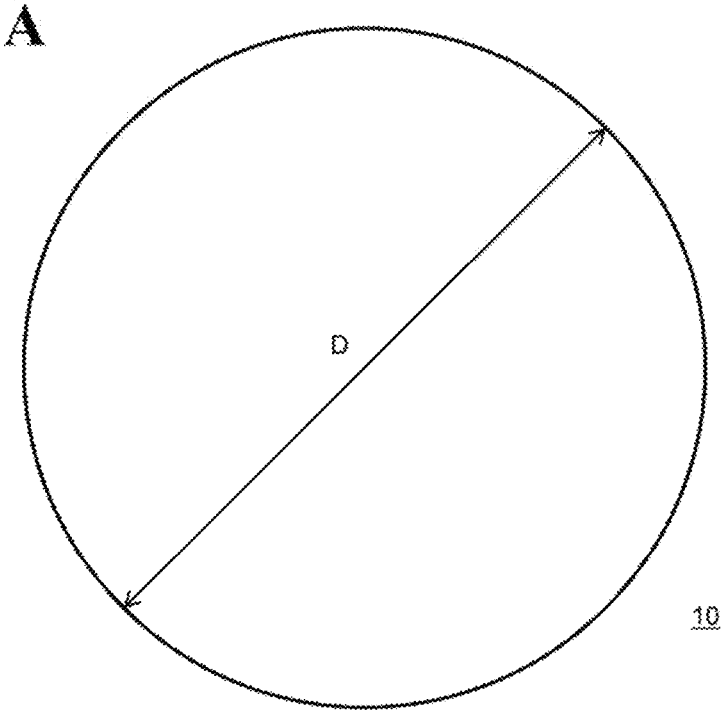
FIG. 1A is a schematic plan view of a nitride crystal substrate 10.

It is thought that characteristics of a device will be degraded if impurities other than shallow donors such as silicon (Si), germanium (Ge), and oxygen (O), which supply electrons, exist in a nitride crystal. Specifically, the carrier mobility may be reduced, the resistance of a diode may be increased, the withstand voltage of a diode may be reduced, and a light emission efficiency may be reduced, for example. Accordingly, it is desirable that concentrations of unintended impurities in the nitride crystal are as low as possible.

As described in Document 4 with regard to concentrations of such impurities, the inventors of the present invention succeeded in making concentrations of all of boron (B), O, carbon (C), and the like in a nitride crystal less than $1\times10^{15}$ $cm^{-3}$ by using a novel manufacturing method.

However, when concentrations of electron traps in the nitride crystal described in Document 4 were measured using isothermal capacitance transient spectroscopy (ICTS), it was found that an electron trap E3 remained at a position of about 0.6 eV from a conduction band and the concentration of E3 exceeded $1\times10^{14}$ $cm^{-3}$.

According to a recent paper (Narita 2020 shown in FIG. 8, which will be described later), for example, the origin of E3 is reported to be iron (Fe) contained in the nitride crystal.

According to this paper, it is thought that the concentration of Fe in the nitride crystal can be estimated indirectly by measuring the concentration of E3 in the nitride crystal using ICTS.

As described in Document 4 mentioned above, the concentration of Fe in the nitride crystal that was grown using the novel manufacturing method was no greater than the lower limit of secondary ion mass spectrometry (SIMS).

However, the concentration of E3 in the nitride crystal described in Document 4, which was measured using ICTS, exceeded $1\times10^{14}$ $cm^{-3}$ as described above, and when the concentration of Fe in the nitride crystal was indirectly estimated based on the concentration of E3, it was revealed that Fe was incorporated into the nitride crystal described in Document 4 at a concentration (about $2\times10^{14}$ $cm^{-3}$ to $7\times10^{14}$ $cm^{-3}$) that was slightly lower than the lower limit of SIMS mentioned above.

According to a report (Tanaka 2016 shown in FIG. 8, which will be described later) regarding the concentration of E3 in a nitride crystal that is obtained using a conventional metalorganic chemical vapor deposition (MOCVD) method or a conventional hydride vapor phase epitaxy (HVPE) method, there is a trade-off relationship between the concentration of E3 and the concentration of C. The origin of E3 is considered to be Fe as described above, and accordingly, this is equivalent to the concentration of Fe having a trade-off relationship with the concentration of C.

Namely, predetermined amounts of Fe and C are present in an environment in which a crystal grows in a conventional MOCVD method or a conventional HVPE method. If a condition under which C is easily taken into the nitride crystal is selected, the intake of Fe is suppressed. On the other hand, if a condition under which C is hardly taken into the nitride crystal is selected, the intake of Fe is promoted.

Specifically, when the concentration of C is about $5\times10^{16}$ $cm^{-3}$, for example, the concentration of Fe can be reduced to approximately $1\times10^{11}$ $cm^{-3}$. On the other hand, when the concentration of C is reduced to about $1\times10^{5}$ $cm^{-3}$, the concentration of Fe may increase up to $1\times10^{15}$ $cm^{-3}$.

Therefore, a nitride crystal in which both the concentration of C and the concentration of Fe are extremely low has never been realized. Specifically, a nitride crystal in which the concentration of C is less than $1\times10^{15}$ $cm^{-3}$ and the concentration of Fe is less than $1\times10^{14}$ cm 3 could not be realized even by using the novel manufacturing method described in Document 4 mentioned above.

In view of the new findings described above, the inventors of the present invention undertook intensive studies to further reduce concentrations of impurities.

Here, as a source of Fe generated in the MOCVD method or the HVPE method, a stainless steel member is conceivable, for example. However, a stainless steel chamber that is used in the MOCVD method is usually sufficiently cooled with water. Also, in the HVPE method, a gas supply pipe that is made of opaque quartz is used at an intermediate portion of a gas supply pipe made of quartz, for example. Therefore, a stainless steel flange portion can be kept from being heated through heat radiation. By taking these measures, it is possible to keep stainless steel members from being excessively heated, and suppress the generation of Fe from these members.

On the other hand, a carbon member is sometimes used in a high-temperature reaction region in an MOCVD apparatus or an HVPE apparatus. A member that is made of high purity C is used as the carbon member, but the carbon member contains Fe as an inevitable impurity at a concentration of about 0.06 ppm or less. Therefore, the inventors of the present invention provided a heat-resistant protective layer (coating layer) made of silicon carbide (SiC), for example, on an outer periphery of the carbon member as described in Document 4.

However, there were cases where SiC became fragile at a growth temperature of the nitride crystal and in an atmosphere of a source gas. Therefore, there was the possibility of cracks forming in the protective layer or the protective layer becoming porous. Accordingly, there was the possibility of an Fe impurity leaking from the carbon member via the protective layer to the growth atmosphere.

Therefore, the inventors of the present invention considered covering surfaces of a carbon member and the like in the high-temperature reaction region with a protective layer made of an iron cyano complex (chemical formula: $Fe_4[Fe(CN)_6]_3$) instead of SiC. It was found that, as a result, leakage of Fe from each member in the high-temperature reaction region to the growth atmosphere can be suppressed and the amount of Fe incorporated into the nitride crystal can be significantly reduced. Furthermore, it was found that a nitride crystal in which both the concentration of C and the concentration of Fe are extremely low can be obtained by combining a manufacturing method that includes a high temperature baking step developed by the inventors of the present invention.

The following embodiments are based on the above findings of the inventors of the present invention.

First Embodiment of the Present Invention

The following describes a first embodiment of the present invention with reference to the drawings.
(1) Nitride Crystal Substrate A nitride crystal substrate 10 according to this embodiment will be described with reference to FIGS. 1A and 1B. FIG. 1A is a schematic plan view of the nitride crystal substrate 10 and FIG. 1B is a schematic side view of the nitride crystal substrate 10.

Figure 1B:
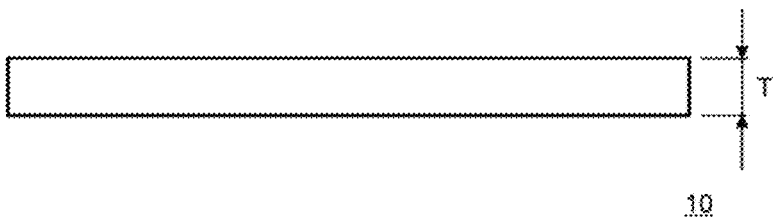
FIG. 1B is a schematic side view of the nitride crystal substrate 10.

As shown in FIGS. 1A and 1B, the nitride crystal substrate 10 of this embodiment (hereinafter also referred to as a "substrate 10") is configured as a circular plate-shaped substrate that is used when manufacturing a semiconductor laminate 1, which will be described later, or a semiconductor device. The substrate 10 is constituted by a single crystal of a group-III nitride semiconductor, and is constituted by, for example, a single crystal of gallium nitride (GaN) in this embodiment.

The orientation of a main surface (upper surface) of the substrate 10 is, for example, a (0001) plane (+c plane, Ga polar plane). Note that the GaN crystal constituting the substrate 10 may have a predetermined off angle with respect to the main surface of the substrate 10. The off angle refers to an angle between a normal direction of the main surface of the substrate 10 and a main axis (c-axis) of the GaN crystal constituting the substrate 10. Specifically, the off angle of the substrate 10 is 0° or more and 1.20 or less, for example.

The main surface of the substrate 10 is an epi-ready surface and has a root mean square roughness (RMS) of 10 nm or less, for example, and preferably 1 nm or less. The "RMS" referred to herein means an RMS that is determined by measuring a 20 μm-square area using an atomic force microscope (AFM).

The diameter D of the substrate 10 is not specifically limited, but is 25 mm or more, for example. If the diameter D of the substrate 10 is less than 25 mm, productivity of a semiconductor device is likely to decrease. Therefore, the diameter D of the substrate 10 is preferably 25 mm or more. The thickness T of the substrate 10 is, for example, 150 m or more and 2 mm or less. If the thickness T of the substrate 10 is less than 150 μm, mechanical strength of the substrate 10 may decrease and it may be difficult to maintain a free-standing state. Therefore, the thickness T of the substrate 10 is preferably 150 m or more. Here, the diameter D of the substrate 10 is 2 inches (50.8 mm), and the thickness T of the substrate 10 is 400 μm, for example.

Impurity Concentration

In this embodiment, the substrate 10 is manufactured by using, as a reaction vessel, a vessel in which a high-temperature reaction region includes a protective layer that is made of an iron cyano complex, and by performing a high temperature baking step, and therefore, the concentration of each impurity contained in the GaN crystal constituting the substrate 10 is lower than a limit of measurement (lower limit of detection) performed using SIMS.

Specifically, the concentration of C in the crystal measured using SIMS in which a raster change method known for its high sensitivity is used is less than $1\times10^{15}$ $cm^3$, for example.

The "raster change method" is a method in which, for example, an area to be subjected to raster-scanning is changed in the course of analysis for depth profile using SIMS to distinguish a level of an element contained in a sample from a background level derived from a SIMS apparatus, thereby obtaining a net concentration of the element contained in the sample at high accuracy.

Also, the concentration of O in the crystal measured using SIMS in which the raster change method is used is less than $1\times10^{15}$ $cm^3$, for example.

Also, the concentration of B in the crystal measured through analysis for depth profile using SIMS is less than $1\times10^{15}$ $cm^{-3}$, for example.

Also, in this embodiment, the crystal is not doped with Si, which is an n-type impurity, and accordingly, the concentration of Si in the crystal measured through analysis for depth profile using SIMS is less than $1\times10^{15}$ $cm^3$, for example.

In this embodiment, the concentration of Fe in the crystal is lower than the lower limit of analysis for depth profile using SIMS, as in Document 4 described above. However, in the crystal of this embodiment, the concentration of Fe estimated based on the concentration of an electron trap E3 is lower than that in Document 4 described above. This will be described later in detail.

Also, the crystal in this embodiment has been grown using the HVPE method as described later, and has not been grown using a flux method in which alkaline metal such as sodium (Na) or lithium (Li) is used as a flux. Therefore, the crystal in this embodiment contains substantially no alkaline metal elements such as Na and Li.

Furthermore, none of the elements of arsenic (As), chlorine (Cl), phosphorus (P), fluorine (F), Na, Li, potassium (K), tin (Sn), titanium (Ti), manganese (Mn), chromium (Cr), molybdenum (Mo), tungsten (W), and nickel (Ni) is detected in the crystal in this embodiment.

In other words, the concentrations of these impurities in the crystal are lower than lower limits of SIMS. The lower limits of detection of these elements in SIMS at present are as follows.

As: $5 \times 10^{12}$ cm$^{-3}$
Cl: $1 \times 10^{14}$ cm$^{3}$
P: $2 \times 10^{15}$ cm$^{3}$
F: $4 \times 10^{13}$ cm$^{-3}$
Na: $5 \times 10^{11}$ cm$^{-3}$
Li: $5 \times 10^{11}$ cm$^{-3}$
K: $2 \times 10^{12}$ cm$^{-3}$
Sn: $1 \times 10^{13}$ cm$^{-3}$
Ti: $1 \times 10^{12}$ cm$^{-3}$
Mn: $5 \times 10^{12}$ cm$^{-3}$
Cr: $7 \times 10^{13}$ cm$^{-3}$
Mo: $1 \times 10^{15}$ cm$^{-3}$
W: $3 \times 10^{16}$ cm$^{-3}$
Ni: $1 \times 10^{14}$ cm$^{-3}$ Electron Trap Concentration In this embodiment, concentrations of electron traps in the crystal are reduced as a result of the substrate 10 being manufactured by using, as the reaction vessel, a vessel in which the high-temperature reaction region includes the protective layer made of an iron cyano complex, and by performing the high temperature baking step as described later.

Figure 2:
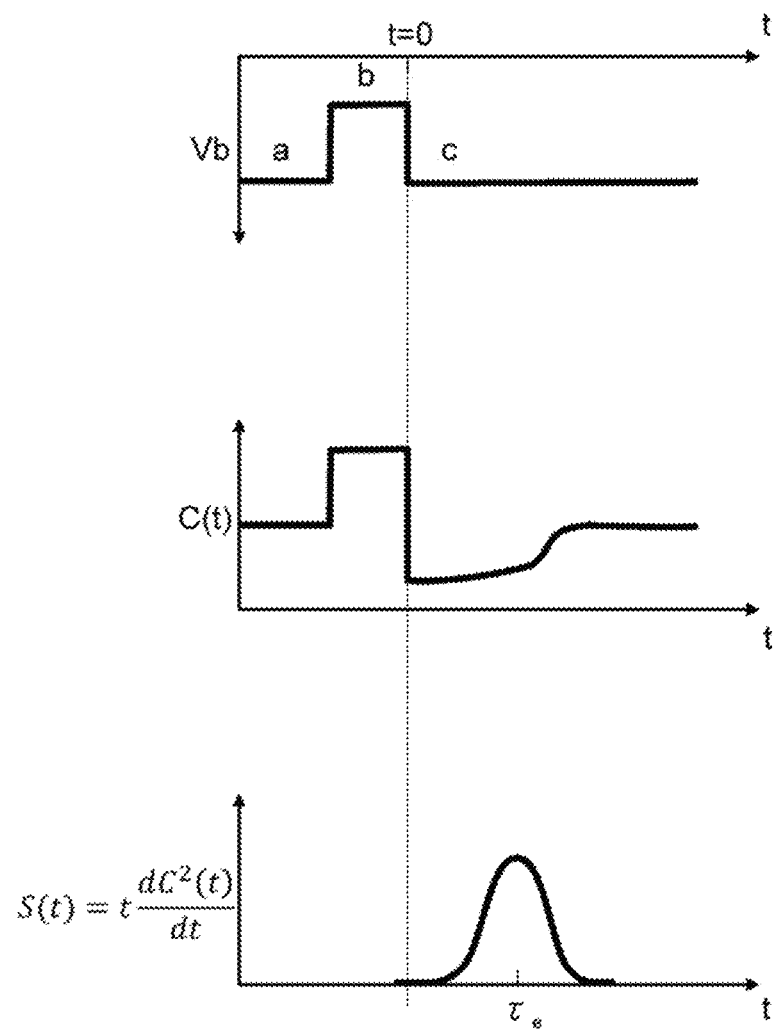
FIG. 2 is a diagram showing a measurement example of isothermal capacitance transient spectroscopy.

Here, ICTS will be described as a method for measuring electron traps with reference to FIG. 2. FIG. 2 is a diagram showing a measurement example of isothermal capacitance transient spectroscopy.

In the measurement performed using ICTS, first, an ohmic electrode is provided on the rear surface side of a sample and a Schottky electrode is provided on the front surface side of the sample. Specifically, the ohmic electrode on the rear surface side of the substrate 10 constituted by the GaN crystal is constituted by titanium (Ti)/aluminum (Al), for example, and the Schottky electrode on the front surface side of the substrate 10 is constituted by nickel (Ni)/gold (Au), for example.

After the preparation of the sample is complete, a reverse bias (bias voltage Vb) is applied at the Schottky junction between the substrate 10 and the Schottky electrode as shown by a in FIG. 2.

Next, as shown by b in FIG. 2, a pulse (filling pulse) in the forward direction is superimposed at the Schottky junction. At this time, electrons are captured by electron traps in the GaN crystal constituting the substrate 10.

Next, as shown by c in FIG. 2, the state where the reverse bias is applied at the Schottky junction is restored. The time t at which the reverse bias is restored is taken to be 0, and the change in the junction capacitance C(t) from t=0 is measured using a high-speed transient capacity meter.

When the reverse bias is restored (t=0), electrons captured at trap levels higher than or equal to the fermi level are emitted to the conduction band. As the electrons are emitted from t=0, the width of the depletion layer gradually decreases and the junction capacitance C(t) increases.

An ICTS spectrum S(t) with respect to a change in the junction capacitance C(t) over time as described above is defined by the following Expression (i).

$$S(t) = t \frac{dC^2(t)}{dt} \quad \text{(i)}$$

The ICTS spectrum S(t) has a peak at a time $t=\tau_e$ that corresponds to a thermal emission time constant ($\tau_e$) of an electron trap level.

Here, when the crystal includes a plurality of electron trap levels and the thermal emission time constant of the i-th level is denoted by $\tau_e^i$, S(t) is expressed by the following Expression (ii).

$$S(t) = \frac{q\epsilon_r\epsilon_0 A^2}{2(V_d - V_b)} \sum_i N_T^i (t/\tau_e^i) \exp(-t/\tau_e^i) \quad \text{(ii)}$$

In the above Expression, q represents the elementary charge of electrons, $\epsilon_r$ represents the relative dielectric constant of the crystal, co represents the dielectric constant of a vacuum, $V_d$ represents a diffusion potential, $V_b$ represents the bias voltage, A represents a junction cross-sectional area, and $N_T^i$ represents the concentration (density) of the i-th trap level.

When the thermal emission time constants $\tau_e^i$ of the respective electron trap levels are sufficiently discrete, S(t) has a peak at each $t=\tau_e^i$. Accordingly, the thermal emission time constants $\tau_e^i$ of the respective electron trap levels can be determined based on the positions of the peaks of the ICTS spectrum S(t). By assigning $t=\tau_e^i$ determined as described above into Expression (ii), concentrations $N_T^i$ of the electron traps can be determined from peak intensities of the ICTS spectrum S(t).

Also, an activation energy $\Delta E_i$ of each electron trap level can be determined from the thermal emission time constant $T_e^i$ of the electron trap level based on the following Expression (iii).

$$\frac{1}{\tau_e^i} = N_C \sigma_n^i v_{th} g \exp\left(-\frac{\Delta E_i}{kT}\right) \quad \text{(iii)}$$

In the above Expression, Nc represents an effective density of states of the conduction band, $\sigma_n^i$ represents a capture cross-sectional area of the i-th electron trap, $v_{th}$ represents a thermal velocity of electrons, g represents degeneracy of the trap, k represents the Boltzmann constant, and T represents an absolute temperature.

Figure 3:
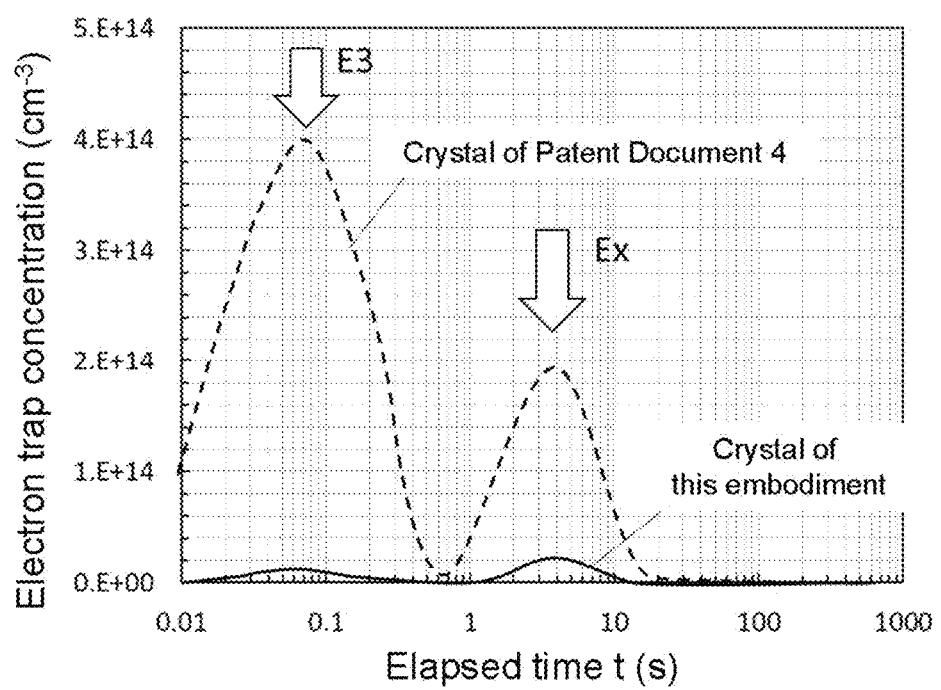
FIG. 3 is a diagram showing a result of measurement of electron trap concentrations in a GaN crystal according to a first embodiment of the present invention and a GaN crystal according to Document 4, which were measured using the isothermal capacitance transient spectroscopy.

Here, electron traps in the GaN crystal of this embodiment will be described with reference to FIG. 3. FIG. 3 is a diagram showing a result of measurement of electron trap concentrations in a GaN crystal of this embodiment (sample A4' doped with a minute amount of Si, which will be described later) and a GaN crystal described in Document 4 (sample B7' doped with a minute amount of Si, which will be described later) measured using the isothermal capacitance transient spectroscopy.

As shown in FIG. 3, the ICTS spectrums S(t) of the GaN crystals measured using ICTS have a plurality of peaks that correspond to different energy levels. Among these, an electron trap that exists in an energy range from 0.5 eV to 0.65 eV from the lower end of the conduction band (under the lower end of the conduction band) will be referred to as "E3", an electron trap that exists in an energy range from 0.15 eV to 0.3 eV from (under) the lower end of the conduction band will be referred to as "E1", and an electron trap that exists in an energy range from 0.68 eV to 0.75 eV from (under) the lower end of the conduction band will be referred to as "Ex".

Note that a measurement temperature in the measurement performed using ICTS is set based on an energy position of each electron trap within a range from 80 K to 350 K, for example. In FIG. 3, the measurement temperature is set to room temperature (300 K) when the electron traps E3 and Ex are measured. On the other hand, the measurement temperature is set within a range from 100 K to 150 K when the electron trap E1 that is at an energy position close to the conduction band is measured.

In the GaN crystal described in Document 4, the concentration of the electron trap E3 was $1 \times 10^4$ cm$^{-3}$ or more (e.g., about $3 \times 10^{14}$ cm$^{-3}$). As described above, the origin of E3 is considered to be Fe, and accordingly, this is equivalent to the concentration of Fe in the GaN crystal described in Document 4 being $1 \times 10^{14}$ cm$^3$ or more.

Also, in the GaN crystal described in Document 4, the concentration of the electron trap E1 exceeded $3 \times 10^{12}$ cm$^{-3}$.

Also, in the GaN crystal described in Document 4, the concentration of the electron trap Ex exceeded $3 \times 10^{13}$ cm$^3$.

In contrast, in the GaN crystal of this embodiment, the concentration of the electron trap E3 is less than $1 \times 10^{14}$ cm$^{-3}$, for example. When the concentration of Fe in the GaN crystal is indirectly estimated as described above, this is equivalent to the concentration of Fe in the GaN crystal of this embodiment being less than $1 \times 10^{14}$ cm$^{-3}$.

Also, the concentration of the electron trap E1 in the GaN crystal of this embodiment is $3 \times 10^{12}$ cm$^{-3}$ or less, for example.

Also, the concentration of the electron trap Ex in the GaN crystal of this embodiment is $3 \times 10^{13}$ cm$^{-3}$ or less, for example.

Furthermore, in the GaN crystal of this embodiment, electron traps other than E1, E3, and Ex did not exist within the temperature range in which the ICTS measurement was performed, i.e., within the temperature range from 80 K to 350 K, and accordingly, it can be said that the total concentration of electron traps that exist in an energy range from 0.1 eV to 1.0 eV from the lower end of the conduction band is less than $1 \times 10^{14}$ cm$^{-3}$.

Relationship between concentration of C and concentration of E3 In this embodiment, the concentration of C and the concentration of E3, which are in the trade-off relationship with each other as described above, are both reduced in the crystal because the substrate 10 is manufactured by using, as the reaction vessel, a vessel in which the high-temperature reaction region includes the protective layer made of an iron cyano complex, and by performing the high temperature baking step as described later. As a result, the GaN crystal of this embodiment also satisfies the following requirements.

Namely, the GaN crystal of this embodiment satisfies the following Expressions (1-1) and (1-2), for example.

$$[E3] < 1 \times 10^{14} \tag{1-1}$$

$$[E3] \cdot [C]^2 \leq 1 \times 10^{43} \tag{1-2},$$

where [C] represents the concentration of carbon in the crystal expressed in the unit of cm$^{-3}$, and

[E3] represents the concentration of the electron trap E3 in the crystal expressed in the unit of cm$^{-3}$.

Furthermore, the GaN crystal of this embodiment preferably satisfies the following Expression (2), for example.

$$[E3] \cdot [C]^2 \leq 1 \times 10^{42} \tag{2}$$

Insulation Property

In this embodiment, the concentrations of conductive impurities (n-type impurities) in the crystal are extremely low as described above. Accordingly, although the concentrations of C, Fe, and the like that form deep levels in the crystal are low, the substrate 10 is configured as a semi-insulating substrate.

Specifically, the resistivity of the GaN crystal constituting the substrate 10 of this embodiment is $1 \times 10^6$ Ωcm or more under a temperature condition of 20° C. or more and 300° C. or less, and is $1 \times 10^5$ Ωcm or more under a temperature condition of more than 300° C. and 400° C. or less.

The upper limit of the resistivity of the GaN crystal is not specifically limited, but is, for example, about $1 \times 10^{10}$ Ωcm.

(2) Method for Manufacturing GaN Substrate

A method for manufacturing the substrate 10 in this embodiment will be specifically described hereinafter.

Figure 4:
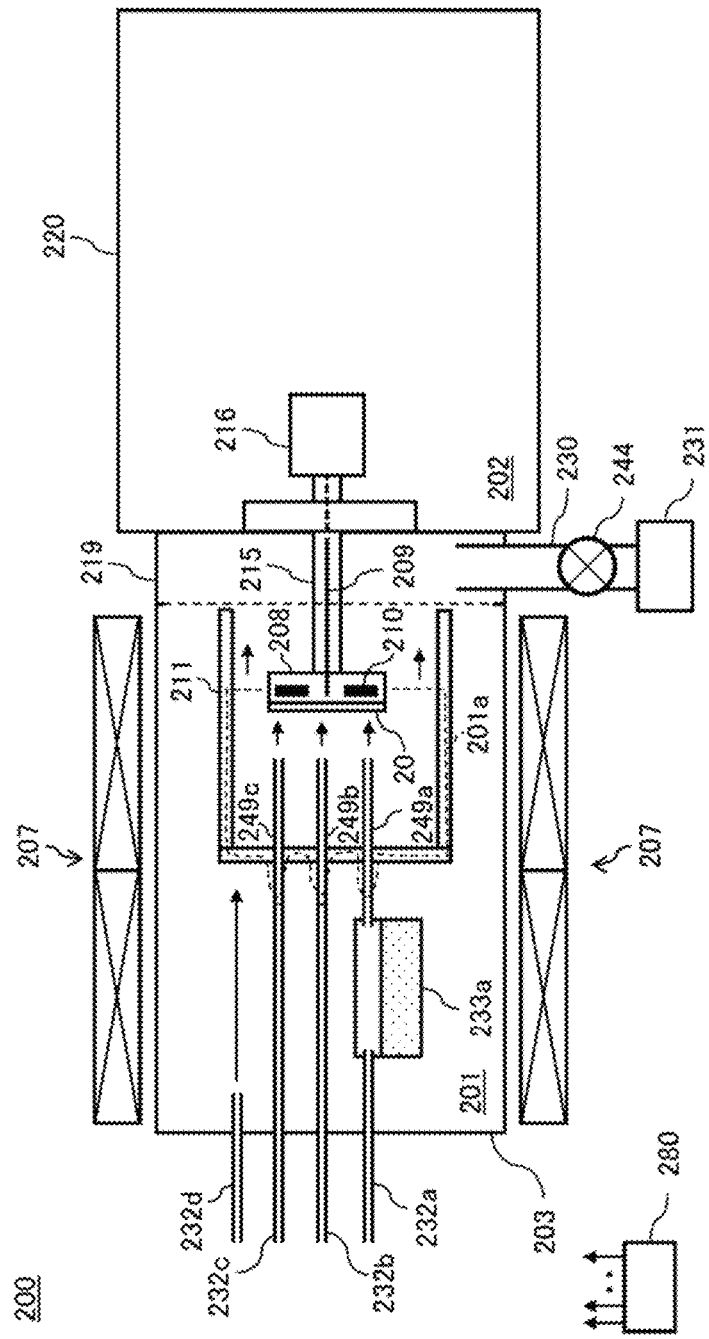
FIG. 4 is a schematic block diagram of an HVPE apparatus 200, illustrating a state of conducting a crystal growth step in a reaction vessel 203.

First, a configuration of an HVPE apparatus 200 used for growing the GaN crystal will be described in detail with reference to FIG. 4. The HVPE apparatus 200 includes a reaction vessel 203 formed into a cylindrical shape, for example. The reaction vessel 203 has a sealed structure so as not to allow entrance of atmospheric air outside thereof or a gas contained in a glove box 220 described later. In the reaction vessel 203, a reaction chamber 201 is formed in which the crystal growth is conducted. In the reaction chamber 201, a susceptor 208 is provided which retains a seed crystal substrate 20 constituted by a GaN single crystal. The susceptor 208 is connected to a rotary axis 215 of a rotary mechanism 216, and thus configured to be freely rotatable. In addition, the susceptor 208 includes an internal heater 210 as a heating portion. The internal heater 210 is configured so that its temperature can be controlled separately from the temperature of a zone heater 207 described later. Moreover, the upstream side and the periphery of the susceptor 208 are covered with a heat shield wall 211. Since the heat shield wall 211 is provided, a gas other than gas supplied from nozzles 249a to 249c described later will not be supplied to the seed crystal substrate 20.

Figure 5:
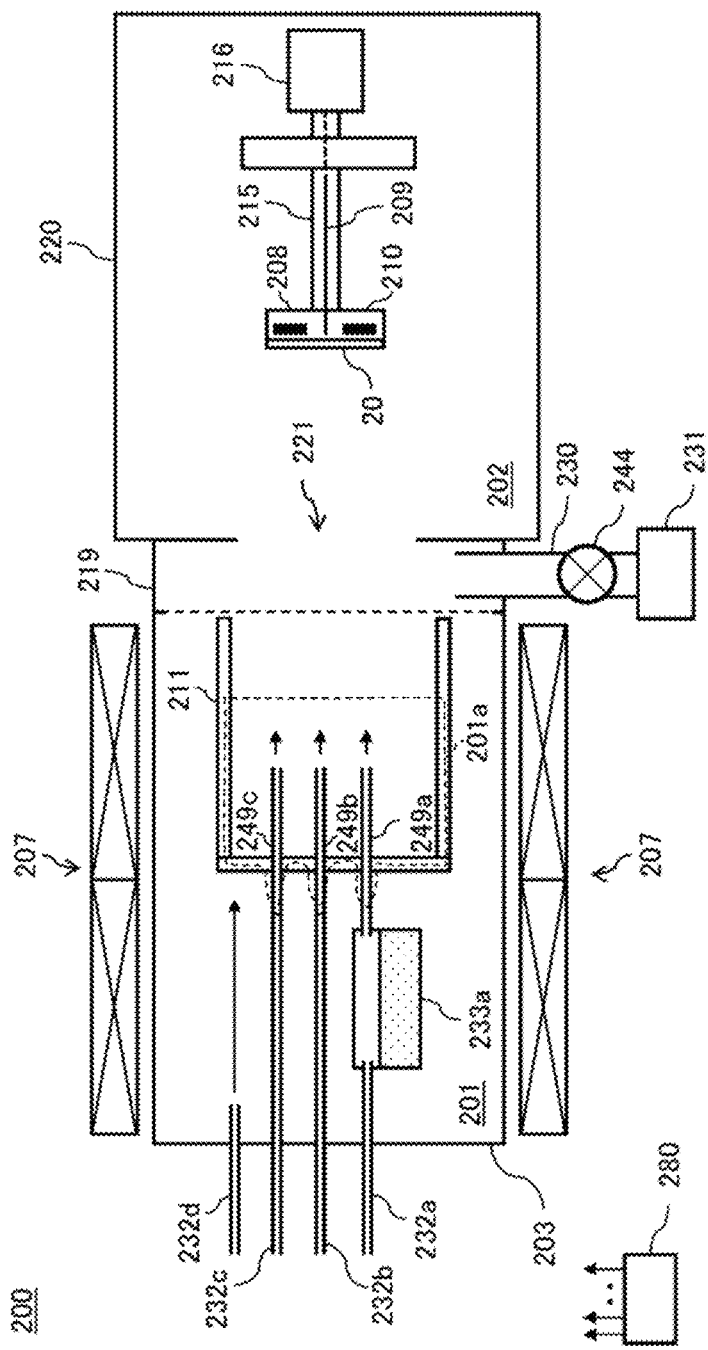
FIG. 5 is a schematic block diagram of the HVPE apparatus 200, illustrating a state where a furnace port 221 of the reaction vessel 203 is opened.

The reaction vessel 203 is connected to the glove box 220 through a cylindrical metal flange 219 made of SUS or the like. The glove box 220 also has an air-tight structure so as not to let the atmospheric air be incorporated therein. An exchanging chamber 202 provided in the glove box 220 is continuously purged with high purity nitrogen (hereinafter also simply referred to as $N_2$ gas), and thus the concentrations of oxygen and water are maintained at low values. The glove box 220 includes a transparent acrylic wall, a plurality of rubber gloves connected to holes penetrating the wall, and a pass box to put an object in and out of the glove box 220. The pass box includes an evacuation mechanism and a $N_2$ purge mechanism, in which the atmospheric air is replaced with $N_2$ gas so that an object can be put in and out of the glove box 220 without letting the atmospheric air containing oxygen be incorporated in the glove box 220. As shown in FIG. 5, a crystal substrate is put in and out of the reaction vessel 203, while a port of the metal flange 219, that is, a furnace port 221 is opened. In this way, recontamination of the surface of each member in the reaction vessel 203 and adherence of the atmospheric air and gas containing various impurities described above to the surface of the member may be prevented, the member being after completion of cleaning and modification through a high temperature baking step described later. The impurities referred to herein include at least any one of $O_2$ and moisture ($H_2O$) derived from atmospheric air; organic substances containing C, O, and hydrogen (H), Na, and K derived from human body or the like; As, Cl, P, and F derived from a gas used in a crystal growth step or a device manufacturing step; Fe, Sn, Ti, Mn, Cr, Mo, W, and Ni derived from metallic members inside the furnace; and the like.

The reaction vessel 203 includes, at its one end, a gas supply pipe 232a for supplying HCl gas into a gas generator 233a described later, a gas supply pipe 232b for supplying ammonia ($NH_3$) gas into the reaction chamber 201, a gas supply pipe 232c for supplying HCl gas for high temperature baking and normal baking into the reaction chamber 201, and a gas supply pipe 232d for supplying nitrogen ($N_2$) gas into the reaction chamber 201. The gas supply pipes 232a to 232c are also configured so as to be able to supply hydrogen ($H_2$) gas and $N_2$ gas as carrier gases in addition to HCl gas and $NH_3$ gas. The gas supply pipes 232a to 232c include a flow rate controller and a valve (both not shown) for each type of these gases, so as to conduct flow rate control and supply/stop of various gases individually for each type of gas. In addition, the gas supply pipe 232d also includes a flow rate controller and a valve (both not shown). $N_2$ gas supplied from the gas supply pipe 232d is used to purge the upstream side and the periphery of the heat shield wall 211 in the reaction chamber 201 to maintain cleanliness of the atmosphere of these portions.

HCl gas supplied from the gas supply pipe 232c and $H_2$ gas supplied from the gas supply pipes 232a to 232c serve as cleaning gases for cleaning the surface of the members in the reaction chamber 201 (particularly, the inside of the heat shield wall 211) in a high temperature baking step and a normal baking step, which will be described later, and also serve as modification gases for modifying the surface to a surface with less possibility to release impurities. $N_2$ gas supplied from the gas supply pipes 232a to 232c serves to appropriately regulate a blowout flow velocity of HCl gas and $H_2$ gas ejected from the tips of the nozzles 249a to 249c so that a desired portion of the reaction chamber 201 (particularly, the inside of the heat shield wall 211) is appropriately cleaned in each baking step.

HCl gas introduced from the gas supply pipe 232a serves as a reactant gas that reacts with a Ga-source to produce GaCl gas which is a halide of Ga, that is, a Ga source gas, in a crystal growth step described later. The Ga source gas is also referred to as "group-III element source gas". Further, $NH_3$ gas supplied from the gas supply pipe 232b serves as a nitriding agent which reacts with GaCl gas to grow GaN, a nitride of Ga, on the seed crystal substrate 20, that is, as an N source gas, in the crystal growth step described later. Hereinafter, GaCl gas and $NH_3$ gas may be collectively referred to as a source gas. $H_2$ gas and $N_2$ gas supplied from the gas supply pipes 232a to 232c serve to appropriately regulate the blowout flow velocity of the source gas which is ejected from the tips of the nozzles 249a to 249c to direct the source gas toward the seed crystal substrate 20, in the crystal growth step described below.

On the downstream side of the gas supply pipe 232a, as described above, the gas generator 233a which contains Ga melt as a Ga-source is provided. The gas generator 233a is provided with the nozzle 249a which supplies GaCl gas produced by the reaction between HCl gas and the Ga melt to a main surface of the seed crystal substrate 20 retained on the susceptor 208. On the downstream side of the gas supply pipes 232b and 232c, the nozzles 249b and 249c are provided, which supply various gases supplied from these gas supply pipes toward the main surface of the seed crystal substrate 20 retained on the susceptor 208. Each of the nozzles 249a to 249c is configured so as to penetrate the upstream side of the heat shield wall 211.

The gas supply pipe 232c is configured to be able to supply, in addition to HCl gas, $H_2$ gas, and $N_2$ gas, a Fe-containing gas such as ferrocene ($Fe(C_5H_5)_2$, abbreviated as $Cp_2Fe$) gas or iron trichloride ($FeCl_3$) gas, a Si-containing gas such as silane ($SiH_4$) gas or dichlorosilane ($SiH_2Cl_2$) gas, or a Mg-containing gas such as bis(cyclopentadienyl) magnesium ($Mg(C_5H_5)_2$, abbreviated as $Cp_2Mg$) gas, as a dopant gas.

A gas supply system is constituted by the gas supply pipes 232a to 232d, the flow rate controllers, the valves, and the nozzles 249a to 249c described above.

The metal flange 219 provided on the other end of the reaction vessel 203 is provided with an exhaust pipe 230 for exhausting the reaction chamber 201. The exhaust pipe 230 includes an APC valve 244 as a pressure regulator and a pump 231, in this order from upstream side. Instead of the APC valve 244 and the pump 231, a blower including a pressure regulation mechanism may be used.

The outer circumference of the reaction vessel 203 is provided with the zone heater 207 which serves as a heating portion and heats the inside of the reaction chamber 201 to a desired temperature. The zone heater 207 includes at least two heaters, one for an upstream side portion surrounding the gas generator 233a and one for a downstream side portion surrounding the susceptor 208, each heater having a temperature sensor and a temperature regulator (both not shown) so as to enable individual regulation of temperature within a range from room temperature to 1200° C.

As described above, the susceptor 208 retaining the seed crystal substrate 20 includes the internal heater 210, a temperature sensor 209, and a temperature regulator (not shown) separately from the zone heater 207, so as to enable temperature regulation at least in a range from room temperature to 1600° C. In addition, the upstream side and the periphery of the susceptor 208 are enclosed by the heat shield wall 211 as described above. Regarding the heat shield wall 211, it is necessary to use a limited member for at least a surface (inner circumference surface) facing the susceptor 208 so as not to generate impurities, as described later. However, there is no limitation on the member to be used for the surface (outer circumference surface) other than the inner circumference surface so long as it is resistant to a temperature of 1600° C. or more. In the heat shield wall 211, at least a portion excluding the inner circumference surface may be constituted by, for example, a highly thermal resistant, non-metallic material such as carbon, silicon carbide (SiC), or tantalum carbide (TaC), or a highly thermal resistant, metallic material such as Mo or W, and may have a structure including laminated plate-like reflectors. With this configuration, the temperature of the outside of the heat shield wall 211 may be suppressed to 1200° C. or less even when the temperature of the susceptor 208 is 1600° C. Since this temperature is equal to or lower than a softening point of quartz, quartz may be used for each member constituting the reaction vessel 203, the gas generator 233a, and upstream side portions of the gas supply pipes 232a to 232d in this configuration.

In the reaction chamber 201, there is a region (high-temperature reaction region) 201a that is heated to 900° C. or more during the crystal growth step described later, and may potentially come into contact with gas supplied to the seed crystal substrate 20.

Here, in this embodiment, at least a portion of the surface of a member that forms the high-temperature reaction region 201a includes a protective layer (which is not denoted by a reference numeral in the drawings) that is made of an iron cyano complex (chemical formula: $Fe_4[Fe(CN)_6]_3$), for example.

The iron cyano complex is called iron blue or Prussian blue and is also used as a material in blue paint. However, in the iron cyano complex, Fe atoms and cyanide ions are bonded extremely firmly, and therefore, the iron cyano complex is extremely difficult to decompose. Commonly, there is concern about the toxicity of cyanides, but the bond between Fe and cyanide ions in the iron cyano complex is extremely stable, and therefore, the iron cyano complex itself is not toxic. As described above, Fe atoms are firmly bonded to cyanide ions, and therefore, it is possible to suppress isolation of Fe from the iron cyano complex and suppress the intake of Fe into the GaN crystal from the iron cyano complex.

By covering the surfaces of members forming the high-temperature reaction region 201a with the protective layer made of the iron cyano complex based on the stable characteristics of the iron cyano complex as described above, it is possible to stably maintain the protective layer made of the iron cyano complex even at a growth temperature of the GaN crystal and a temperature of the high temperature baking step and in the atmosphere of the source gas. Namely, it is possible to suppress cracking of the protective layer and to keep the protective layer from becoming porous.

However, if a member that forms the high-temperature reaction region 201a and is made of carbon or the like is directly covered with the protective layer made of the iron cyano complex, there is a risk that cracks will form in the protective layer due to physical impact.

Therefore, in this embodiment, an undercoat layer (a buffer layer or an adhesion strengthening layer) is preferably provided between the main body of a member that forms the high-temperature reaction region 201a and the protective layer. An example of the material of the undercoat layer is SiC. If such an undercoat layer is provided between the main body and the protective layer, the protective layer can be firmly attached to the main body of the member forming the high-temperature reaction region 201a, via the undercoat layer. As a result, the strength of the protective layer can be ensured.

Examples of portions in which the protective layer is provided in the members forming the high-temperature reaction region 201a include a portion of the inside wall of the heat shield wall 211 on the upstream side of the susceptor 208, portions of the nozzles 249a to 249c penetrating through the heat shield wall 211 and located on the inner side of the heat shield wall 211, a portion of the outer side of the heat shield wall 211 that is heated to 900° C. or more in the crystal growth step, and the surface of the susceptor 208.

The thickness of the protective layer is not limited, but is, for example, 30 µm or more and 300 µm or less. If the thickness of the protective layer is 30 µm or more, durability of the protective layer can be ensured. If the thickness of the protective layer is 300 µm or less, it is possible to suppress cracking of the protective layer due to a difference between the coefficient of thermal expansion of a base material and the coefficient of thermal expansion of the protective layer when the temperature is raised or lowered. The thickness of the undercoat layer is not limited, but is, for example, 30 µm or more and 200 µm or less. If the thickness of the undercoat layer is 30 µm or more, adhesion of the undercoat layer can be ensured. If the thickness of the undercoat layer is 200 m or less, it is possible to suppress cracking of the undercoat layer due to a difference between the coefficient of thermal expansion of the base material and the coefficient of thermal expansion of the undercoat layer when the temperature is raised or lowered.

Members included in the HVPE apparatus 200, such as the various valves and flow rate controllers included in the gas supply pipes 232a to 232d, the pump 231, the APC valve 244, the zone heater 207, the internal heater 210, and the temperature sensor 209 are connected to a controller 280 configured as a computer.

Next, an example of a treatment for epitaxially growing the GaN single crystal on the seed crystal substrate 20 using the above-described HVPE apparatus 200 will be described in detail with reference to FIG. 4. In the following description, the operation of each part constituting the HVPE apparatus 200 is controlled by the controller 280.

High Temperature Baking Step

This step is conducted when the inside of the reaction chamber 201 and the inside of the exchanging chamber 202 are exposed to the atmospheric air, since maintenance of the HVPE apparatus 200 or loading of the Ga-source into the gas generator 233a is performed. Before performing this step, it should be confirmed that air tightness of the reaction chamber 201 and the exchanging chamber 202 is secured. After the air tightness is confirmed, the inside of the reaction chamber 201 and the inside of the exchanging chamber 202 are each replaced with $N_2$ gas. Thereafter, the surfaces of various members constituting the reaction chamber 201 are subjected to heat treatment while the inside of the reaction vessel 203 is in a predetermined atmosphere. The treatment is conducted in a state where the seed crystal substrate 20 is not loaded into the reaction vessel 203, and the Ga-source is loaded into the gas generator 233a.

In this step, the temperature of the zone heater 207 is regulated to the temperature similar to the temperature in the crystal growth step. Specifically, the temperature of an upstream-side heater surrounding the gas generator 233a is set to a temperature from 700° C. to 900° C., while the temperature of a downstream-side heater surrounding the susceptor 208 is set to a temperature from 1000° C. to 1200° C. Further, the temperature of the internal heater 210 is set to a predetermined temperature of 1500° C. or more. As described later, in the crystal growth process, since the internal heater 210 is turned off or set to a temperature of 1200° C. or less, the temperature of the high-temperature reaction region 201a becomes 900° C. or more and less than 1200° C. On the other hand, in the high temperature baking step, since the temperature of the internal heater 210 is set to the temperature of 1500° C. or more, the temperature of the high-temperature reaction region 201a becomes 1000° C. to 1500° C. or more, the temperature in the neighborhood of the susceptor 208 on which the seed crystal substrate 20 is placed becomes as high as 1500° C. or more, and, as for other locations, the temperature at each location becomes at least 100° C. or more higher than the temperature during the crystal growth step. Portions in the high-temperature reaction region 201a that have the lowest temperature, which is 900° C., while the crystal growth step is conducted, specifically upstream side portions of the nozzles 249a to 249c on the inner side of the heat shield wall 211 are portions where an adhering impurity gas is most difficult to remove. Since the temperature of the internal heater 210 is set to 1500° C. or more so that temperatures of these portions become at least 1000° C. or more, the effect of cleaning and modification treatment described later, that is, the effect of reducing impurities in the GaN crystal to be grown can be sufficiently attained. When the temperature of the internal heater 210 is set to a temperature of less than 1500° C., the high-temperature reaction region 201a includes a point of which the temperature cannot be sufficiently raised, and thus it becomes difficult to attain the effect of cleaning and modification treatment described later, that is, the effect of reducing impurities in the GaN crystal.

The upper limit of the temperature of the internal heater 210 in this step depends on the ability of the heat shield wall 211. So long as the temperature of the quartz parts and the like on the outside of the heat shield wall 211 can be suppressed within a range not exceeding their heat resistant temperature, the higher the temperature of the internal heater 210 is, the more easily the effect of cleaning and modification treatment in the reaction chamber 201 can be obtained. When the temperature of the quartz parts and the like on the outside of the heat shield wall 211 exceeds their heat resistant temperature, maintenance frequency and the cost of the HVPE apparatus 200 are increased in some cases.

Further, in this step, after the temperatures of the zone heater 207 and the internal heater 210 have reached the above-described predetermined temperatures, $H_2$ gas is supplied from each of the gas supply pipes 232a and 232b, for example, at a flow rate of about 3 slm. Also, HCl gas is supplied from the gas supply pipe 232c at a flow rate of about 2 slm, for example, and $H_2$ gas is supplied from the gas supply pipe 232c at a flow rate of about 1 slm, for example. Also, $N_2$ gas is supplied from the gas supply pipe 232d at a flow rate of about 10 slm, for example. Baking is conducted in the reaction chamber 201 by maintaining this state for a predetermined period. Since the supply of $H_2$ gas and HCl gas is started at the above-described timing, that is, after the temperature in the reaction chamber 201 is raised, an amount of gas which flows out wastefully without contributing to the cleaning and modification treatment described later can be reduced, and a cost for the treatment of the crystal growth can be reduced.

In the high temperature baking step in this embodiment, it is preferable that $O_2$ gas is not supplied. That is, it is preferable that "oxidation sequence" of supplying $O_2$ gas, which is described in Document 4, is not performed. If $O_2$ gas is supplied, there is a risk that the iron cyano complex will be oxidized and the protective layer will become fragile. In contrast, when 02 gas is not supplied and the high temperature baking step is performed in a gas atmosphere in which $O_2$ gas is not intentionally included, oxidation of the iron cyano complex can be suppressed and the protective film can be kept from becoming fragile.

Further, this step is conducted while operating the pump 231, and at this time, an opening degree of the APC valve 244 is regulated to maintain the pressure in the reaction vessel 203 at a pressure of 0.5 atm or more and 2 atm or less, for example. Also, since this step is performed while the reaction vessel 203 is exhausted, removal of the impurities from the reaction vessel 203, that is, cleaning of the inside of the reaction vessel 203 can be efficiently performed. When the pressure in the reaction vessel 203 is less than 0.5 atm, it becomes difficult to attain the effect of cleaning and modification treatment described later. In addition, when the pressure in the reaction vessel 203 exceeds 2 atm, the members in the reaction chamber 201 will receive excessive etching damage.

Further, in this step, a partial pressure ratio of HCl gas to $H_2$ gas (HCl partial pressure/$H_2$ partial pressure) in the reaction vessel 203 is set to 1/50 to 1/2, for example. When the above-described partial pressure ratio is smaller than 1/50, it becomes difficult to attain the effect of cleaning and modification treatment in the reaction vessel 203. In addition, when the partial pressure ratio exceeds 1/2, the members in the reaction chamber 201 will receive excessive etching damage.

The partial pressures can be controlled by regulating the flow rates of the flow rate controllers provided on the gas supply pipes 232a to 232c.

When this step is performed for at least 30 minutes and no longer than 300 minutes, for example, at least the surfaces of various members forming the high temperature reaction region 201a in the reaction chamber 201 can be cleaned and foreign matters adhering to the surfaces can be removed. Also, by keeping temperatures of the surfaces of these members 100° C. or more higher than their temperatures in the crystal growth step described later, it is possible to promote release of impurity gas from these surfaces, and thus modify these surfaces to surfaces where the release of impurities such as Si, B, Fe, O, and C hardly occurs (where outgas hardly occurs) under temperature and pressure conditions in the crystal growth step. Note that if this step is performed for a period shorter than 30 minutes, the effect of cleaning and modification treatment described above may be insufficient. Also, if this step is performed for a period longer than 300 minutes, the members forming the high-temperature reaction region 201a will be excessively damaged.

When $H_2$ gas and HCl gas are supplied into the reaction vessel 203, the supply of $NH_3$ gas into the reaction vessel 203 is not conducted. If $NH_3$ gas is supplied into the reaction vessel 203 in this step, it becomes difficult to attain the above-described effect of cleaning and modification treatment, particularly the effect of the modification treatment.

Further, when $H_2$ gas and HCl gas are supplied into the reaction vessel 203, halogen-based gas such as chlorine ($Cl_2$) gas may be supplied in place of HCl gas. In this case, the above-described effect of cleaning and modification treatment can be similarly obtained.

In addition, when $H_2$ gas and HCl gas are supplied into the reaction vessel 203, $N_2$ gas may be added as a carrier gas from the gas supply pipes 232a to 232c. Since the blowout flow velocity of the gas from the nozzles 249a to 249c can be regulated by adding $N_2$ gas, generation of a portion where the above-described cleaning and modification treatment is incomplete can be prevented. Rare gas such as Ar gas or He gas may be supplied in place of $N_2$ gas.

Upon completion of the above-described cleaning and modification treatment, output of the zone heater 207 is reduced and the temperature in the reaction vessel 203 is lowered, for example, to 200° C. or less, that is, the temperature is lowered to a temperature at which the seed crystal substrate 20 can be loaded into the reaction vessel 203. Further, the supply of $H_2$ gas and HCl gas into the reaction vessel 203 is stopped and the inside of the reaction vessel is purged with $N_2$ gas. Upon completion of the purge in the reaction vessel 203, the opening degree of the APC valve 244 is regulated so that the pressure in the reaction vessel 203 becomes atmospheric pressure or slightly higher than atmospheric pressure, while the supply of $N_2$ gas into the reaction vessel 203 is maintained.

Normal Baking Step

The above-described high temperature baking step is conducted when the inside of the reaction chamber 201 and the inside of the exchanging chamber 202 are exposed to the atmospheric air. However, when the crystal growth step is performed, the inside of the reaction chamber 201 and the inside of the exchanging chamber 202 are not ordinarily exposed to atmospheric air before, during, and after the crystal growth step. Accordingly, the high temperature baking step is not required. In this case, since the crystal growth step is performed, polycrystalline GaN will adhere to the surfaces of the nozzles 249a to 249c, the surface of the susceptor 208, the inside wall of the heat shield wall 211, and the like. When the subsequent crystal growth step is conducted with the polycrystalline GaN remaining, polycrystalline GaN powder, Ga droplets, or the like scattered upon separation from the polycrystal will adhere to the seed crystal substrate 20. As a result, good crystal growth is inhibited. Therefore, the normal baking step is conducted after the crystal growth step in order to remove the above-described polycrystalline GaN. The normal baking step can be performed using a treatment procedure and treatment conditions similar to those in the high temperature baking step, other than that the internal heater 210 is turned off and the temperature in the neighborhood of the susceptor 208 is set to 1000° C. to 1200° C. By performing the normal baking step, polycrystalline GaN can be removed from the reaction chamber 201.

Crystal Growth Step

After the high temperature baking step or the normal baking step is conducted, and upon completion of lowering of the temperature and the purge of the inside of the reaction vessel 203, the furnace port 221 of the reaction vessel 203 is opened, and the seed crystal substrate 20 is placed on the susceptor 208 as shown in FIG. 5. The furnace port 221 is isolated from the atmospheric air and connected to the glove box 220 which is continuously purged with $N_2$ gas. The glove box 220 includes, as described above, a transparent acrylic wall, a plurality of rubber gloves connected to holes penetrating the wall, and a pass box to put an object in and out of the glove box 220. Since the atmospheric air in the pass box is replaced with $N_2$ gas, the object can be put in and out of the glove box 220 without letting the atmospheric air be incorporated in the glove box 220. Since the seed crystal substrate 20 is placed on the susceptor using such a mechanism, recontamination of each member in the reaction vessel 203 and re-adhesion of impurity gas to these members can be prevented, the members being after completion of cleaning and modification through the high temperature baking step. The seed crystal substrate 20 is placed on the susceptor 208 such that the surface of the seed crystal substrate 20, that is, the main surface (crystal growth surface, base surface) on the side facing the nozzles 249a to 249c is, for example, a (0001) plane, that is, +c plane (Ga polar plane) of the GaN crystal.

Figure 6A:
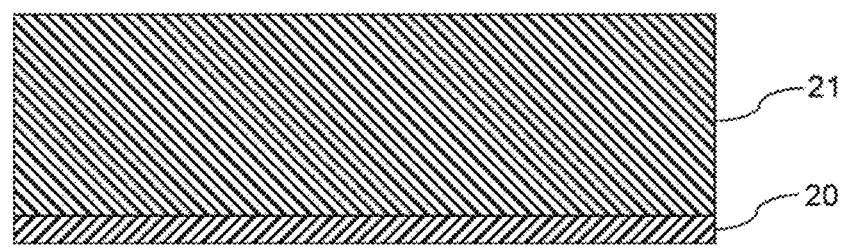
FIG. 6A is a diagram illustrating a state where a crystal film 21 has been grown to be thick on a seed crystal substrate 20.

Upon completion of loading the seed crystal substrate 20 into the reaction chamber 201, the furnace port 221 is closed, and the supply of $H_2$ gas, or $H_2$ gas and $N_2$ gas into the reaction chamber 201 is started while the reaction chamber 201 is heated and exhausted. Thereafter, when the temperature and the pressure inside the reaction chamber 201 respectively reach a desired treatment temperature and a desired treatment pressure to attain a desired atmosphere in the reaction chamber 201, the supply of HCl gas and $NH_3$ gas from the gas supply pipes 232a and 232b is started, and the GaCl gas and $NH_3$ gas are supplied to the surface of the seed crystal substrate 20. Thus, as shown in a cross-sectional view in FIG. 6A, a GaN crystal is epitaxially grown on the surface of the seed crystal substrate 20 to form a GaN crystal film 21.

In this step, the supply of $NH_3$ gas into the reaction chamber 201 is preferably started before or at the time when the temperature of the seed crystal substrate 20 reaches 500° C., in order to prevent thermal decomposition of the GaN crystal constituting the seed crystal substrate 20. Further, in order to improve in-plane film thickness uniformity or the like of the GaN crystal film 21, this step is preferably conducted while the susceptor 208 is rotating.

In this step, the temperature of the zone heater 207 is set to, for example, from 700° C. to 900° C. for the upstream-side heater surrounding the gas generator 233a, whereas the temperature is set to, for example, from 1000° C. to 1200° C. for the downstream-side heater surrounding the susceptor 208. Accordingly, the temperature of the susceptor 208 is regulated to a predetermined crystal growth temperature from 1000° C. to 1200° C. In this step, the internal heater 210 may be turned off but temperature control may be conducted using the internal heater 210 so long as the temperature of the susceptor 208 is in the above-described range from 1000° C. to 1200° C.

Examples of other treatment conditions of this step include the followings:

Treatment pressure: 0.5 to 2 atm;
Partial pressure of GaCl gas: 0.1 to 20 kPa;
Partial pressure of $NH_3$ gas/partial pressure of GaCl gas: 1 to 100; and
Partial pressure of $H_2$ gas/partial pressure of GaCl gas: 0 to 100.

Further, when GaCl gas and $NH_3$ gas are supplied to the surface of the seed crystal substrate 20, $N_2$ gas may be added as a carrier gas from each of the gas supply pipes 232a to 232c. If $N_2$ gas is added to regulate the blowout flow velocity of the gas supplied from the nozzles 249a to 249c, distribution of a supply amount or the like of the source gas on the surface of the seed crystal substrate 20 can be appropriately controlled, and a uniform growth rate distribution across the surface can be attained. Rare gas such as Ar gas or He gas may be supplied in place of $N_2$ gas.

Unloading Step

When the GaN crystal film 21 is grown to a desired thickness on the seed crystal substrate 20, the supply of HCl gas and $H_2$ gas into the reaction chamber 201 and heating by the zone heater 207 are stopped while $NH_3$ gas and $N_2$ gas are supplied into the reaction chamber 201 and the reaction chamber 201 is exhausted. When the temperature in the reaction chamber 201 decreased to 500° C. or less, the supply of $NH_3$ gas is stopped, and the atmosphere in the reaction chamber 201 is replaced with $N_2$ gas and is restored to the atmospheric pressure. Then, the temperature in the reaction chamber 201 is lowered, for example, to a temperature of 200° C. or less, that is, a temperature at which the crystal ingot of GaN (the seed crystal substrate 20 with the GaN crystal film 21 formed on the surface) can be unloaded from the reaction vessel 203. Thereafter, the crystal ingot is unloaded from the reaction chamber 201 through the glove box 220 and the pass box.

Slicing Step

Figure 6B:
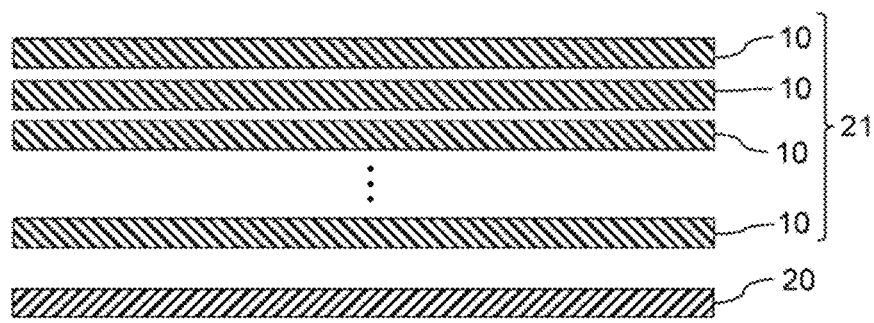
FIG. 6B is a diagram illustrating a state where a plurality of substrates 10 is obtained by slicing the crystal film 21 which has been grown to be thick.

Since the unloaded crystal ingot is subsequently sliced, for example, in parallel to a growth plane, one or more substrates 10 can be obtained as shown in FIG. 6B. This slicing process can be conducted using, for example, a wire saw or an electric discharge machine. The front surface (+c plane) of the substrate 10 is subsequently subjected to a predetermined abrasive machining to process this plane into an epi-ready mirror-surface. The rear surface (−c plane) of the substrate 10 is processed into a lapped surface or a mirror-surface.

The above-described high temperature baking step, the normal baking step, the crystal growth step, and the unloading step are preferably conducted in the order described below. Namely, for example, these steps are preferably conducted in the following order: exposure of the inside of the reaction chamber 201 and the exchanging chamber 202 to atmospheric air→high temperature baking step→crystal growth step→unloading step→(normal baking step→crystal growth step→unloading step)×n, where n is an integer of 1 or more.

(3) Effects Obtained According to this Embodiment

According to this embodiment, one or more effects described below can be obtained.

(a) In this embodiment, at least a portion of the surfaces of the members forming the high-temperature reaction region 201a is covered with the protective layer made of an iron cyano complex (chemical formula: $Fe_4[Fe(CN)_6]_3$), and therefore, leakage of Fe from the members forming the high-temperature reaction region 201a to the growth atmosphere can be suppressed and an amount of Fe incorporated into the GaN crystal can be significantly reduced. Furthermore, by combining the manufacturing method including the high temperature baking step developed by the inventors of the present invention, it is possible to obtain a GaN crystal in which both the concentration of C and the concentration of the electron trap E3, which corresponds to the concentration of Fe, are extremely low.

Specifically, the concentration of C in the crystal measured using SIMS in which the raster change method is used can be made less than $1\times10^{15}$ cm$^{-3}$, and the concentration of the electron trap E3 in the GaN crystal can be made less than $1\times10^{14}$ cm$^{-3}$, and preferably less than $2\times10^{13}$ cm$^{-3}$.

Also, the GaN crystal of this embodiment satisfies the above Expression (1-1): $[E3]<1\times10^{14}$ while satisfying the above Expression (1-2): $[E3]\cdot[C]^2 1\times10^{43}$, or preferably the above Expression (2): $[E3]\cdot[C]^2 \leq 1\times10^{42}$.

As described above, by manufacturing a GaN crystal using the above-described manufacturing method, it is possible to significantly reduce both the concentration of C and the concentration of the electron trap E3, which are reported to be in a trade-off relationship with each other.

As a result, the GaN crystal of this embodiment has excellent crystal quality such as low impurity concentrations and low trap concentrations, which are significantly reduced compared with those in conventional GaN crystals in which at least either the concentration of C or the concentration of E3 is high.

Also, when a semiconductor device is manufactured using the substrate 10 obtained by slicing the GaN crystal of this embodiment, it is possible to suppress degradation of the device due to diffusion of impurities and suppress instability of the operation of the device due to charge and discharge of traps derived from impurities, when compared with a case where a substrate constituted by a conventional GaN crystal in which at least either the concentration of C or the concentration of E3 is high is used.

(b) In this embodiment, a vessel in which at least a portion of surfaces of members forming the high-temperature reaction region 201a includes the protective layer made of an iron cyano complex is used as the reaction vessel 203, and therefore, it is possible to stably maintain the protective layer made of the iron cyano complex even at the growth temperature of the GaN crystal and the temperature of the high temperature baking step and in the atmosphere of the source gas. That is, it is possible to suppress cracking of the protective layer and keep the protective layer from becoming porous. As a result, it is possible to suppress leakage of impurities such as Fe from the members forming the high-temperature reaction region 201a, which are made of carbon or the like, to the growth atmosphere.

Furthermore, it is possible to clean and modify the surfaces of the members forming the high-temperature reaction region 201a by supplying $H_2$ gas and halogen-based gas into the reaction vessel 203 in the high temperature baking step while heating the high-temperature reaction region 201a to 1500° C. or more, without supplying $NH_3$ gas into the reaction vessel 203. That is, it is possible to promote release of impurity gas from the surfaces of the members forming the high-temperature reaction region 201a, and thus modify these surfaces to surfaces where the release of impurities such as C hardly occurs (where outgas hardly occurs) under the temperature and pressure conditions in the crystal growth step.

As a result of these, it is possible to significantly reduce both the concentration of C and the concentration of the electron trap E3, which corresponds to the concentration of Fe, in the GaN crystal of this embodiment.

(c) In this embodiment, the crystal quality of the GaN crystal can be improved by manufacturing the GaN crystal using the above-described manufacturing method to significantly reduce concentrations of impurities. Therefore, not only the concentration of the electron trap E3 in the GaN crystal can be reduced, but also concentrations of other electron traps can be reduced.

Specifically, the concentration of the electron trap E1 can be made $3\times10^{12}$ cm$^{-3}$ or less, and the concentration of the electron trap Ex can be made $3\times10^{14}$ cm$^{-3}$ or less. The origins of these traps E1 and Ex are not clear at present. However, the concentrations of E1 and Ex are reduced when the protective layer according to this embodiment is used, and accordingly, both of E1 and Ex are thought to be traps relating to impurities derived from base materials of the members forming the high-temperature reaction region 201a, like the trap E3.

Since the concentrations of various electron traps that may be generated in the GaN crystal are reduced as described above, it is possible to prevent the operation of a device from becoming unstable due to charge and discharge of the electron traps.

(d) In this embodiment, concentrations of impurities in the GaN crystal other than C can also be significantly reduced as a result of the GaN crystal being manufactured using the above-described manufacturing method. Specifically, the concentration of O in the crystal measured using SIMS in which the raster change method is used can be made less than $1\times10^{15}$ cm$^{-3}$. Also, the concentration of B in the crystal measured through analysis for depth profile using SIMS can be made less than $1\times10^{15}$ cm$^{-3}$.

(e) Since the GaN crystal obtained according to this embodiment is of high purity as described above, it possesses high insulation property, i.e., a resistivity of $1\times10^6$ Ωcm or more under a temperature condition of 20° C. or more and 300° C. or less. When a GaN crystal contains a large amount of donor impurities such as Si or O, there is a known method, as disclosed in Japanese Unexamined Patent Application Publication No. 2007-534580, of adding into the crystal donor-compensating impurities (hereinafter referred to as compensating impurities) such as Mn, Fe, cobalt (Co), Ni, or copper (Cu) in order to improve the insulation property of the crystal. However, this method has a problem in that the quality of the GaN crystal is likely to be degraded due to the addition of the compensating impurities. For example, when the compensating impurities are added into the GaN crystal, a crack is likely to form in a substrate obtained by slicing the crystal. Further, when the compensating impurities are diffused over a laminated structure formed on the substrate, characteristics of a semiconductor device fabricated using this substrate are likely to be degraded. In contrast, the GaN crystal of this embodiment provides high insulation property without the compensating impurities being added, and as a result, a problem of degraded crystallinity, which frequently occurs in the conventional method, can be avoided.

(d) The insulation property of the GaN crystal obtained according to this embodiment is less temperature dependent and more stable compared to the insulation property obtained by adding a compensating impurity into the crystal. Indeed, it seems that an insulation property similar to that of the GaN crystal of this embodiment can be imparted by adding Fe to a GaN crystal containing Si or O at a concentration of, for example, $1 \times 10^{17}$ cm$^{-3}$ or more, the concentration of Fe exceeding the concentration of Si or O. However, the level of Fe which is used as a compensating impurity is about 0.6 eV, which is relatively low. Therefore, the insulation property obtained by adding Fe is more easily deteriorated with an increase in the temperature or the like, compared to the insulation property of the GaN crystal of this embodiment. On the contrary, according to this embodiment, the insulation property can be attained without adding compensating impurities. Accordingly, the problem of increased temperature dependence, which frequently occurs in the conventional method, can be avoided.

(e) The GaN crystal obtained according to this embodiment has high purity as described above. Accordingly, when the crystal is made into an n-type semiconductor by Si ion implantation or when the crystal is made into a p-type semiconductor by Mg ion implantation, the amount of ions to be implanted can be reduced. In other words, the GaN crystal of this embodiment is more advantageous compared with conventional GaN crystals that contain more impurities such as Fe, in that a desired semiconductor property can be imparted while degradation of the crystal quality resulting from ion implantation is suppressed as much as possible. In addition, the GaN crystal of this embodiment is more advantageous compared with conventional GaN crystals containing more impurities also in that the GaN crystal of this embodiment has extremely low concentrations of impurities which may cause carrier scattering, and thus can avoid a reduction in the carrier mobility.

Second Embodiment of the Present Invention

Next, a second embodiment of the present invention will be described mainly on the difference from the first embodiment.

A GaN crystal of this embodiment is similar to the GaN crystal of the first embodiment in that both the concentration of C and the concentration of the electron trap E3 are extremely low, but differs from the GaN crystal of the first embodiment in that the concentration of Si is $1 \times 10^5$ cm$^{-3}$ or more. Since the GaN crystal of this embodiment contains Si at such a concentration, it has conductive property, i.e., a resistivity of $1 \times 10^2$ Ωcm or less under the temperature condition of 20° C. or more and 300° C. or less, and functions as a so-called n-type semiconductor crystal. For example, the concentration of Si may be $1 \times 10^{15}$ cm$^{-3}$ or more and $5 \times 10^{19}$ cm$^{-3}$ or less. In this case, the concentration of free electrons (the concentration of n-type carriers) under the temperature condition of 20° C. or more and 300° C. or less is, for example, $1 \times 10^{15}$ cm$^{-3}$ or more and $5 \times 10^{19}$ cm$^{-3}$ or less, and the resistivity under the same temperature condition is, for example, $1 \times 10^4$ Ωcm or more and 100 Ωcm or less.

In the GaN crystal of this embodiment, the concentration of Si and the concentration of free electrons in the crystal were almost the same value. This indicates that actual concentrations of impurities (Fe or C which compensates free electrons, O which serves as a donor, or the like), from which carriers are derived, other than Si are extremely low, and the GaN crystal contains such impurities in only negligible amounts compared to $1 \times 10^{15}$ cm$^{-3}$ which is the minimum value of the Si concentration in this embodiment.

A Si-containing gas such as SiH$_4$ gas or SiH$_2$Cl$_2$ gas may be supplied along with the source gas (GaCl gas+NH$_3$ gas) to the seed crystal substrate 20 to add Si into the GaN crystal, in the above-described crystal growth step. A partial pressure ratio of the Si-containing gas to the group-III source gas in the reaction vessel 203 (partial pressure of the Si-containing gas/total partial pressure of GaCl gas) may be, for example, $\frac{1}{10^8}$ to $\frac{1}{10^3}$. Further, the substrate 10 may be obtained in the same manner as in the first embodiment, and then Si ions may be implanted to the resulting substrate 10 to add Si into the GaN crystal.

Since each of the concentrations of B, Fe, O, and C in the GaN crystal obtained according to this embodiment is extremely low as in the GaN crystal obtained according to the first embodiment, the GaN crystal of this embodiment has a better quality compared with conventional GaN crystals containing these impurities in larger amounts. According to this embodiment, since the concentrations of impurities such as the concentration of Fe estimated from the concentration of the electron trap E3 in the GaN crystal are low as described above, a desired conductive property (n-type semiconductor property) can be imparted to the GaN crystal even when an amount of Si to be added is suppressed. Namely, the GaN crystal of this embodiment is more advantageous compared with conventional GaN crystals containing more impurities such as Fe or C, in that a desired semiconductor property can be imparted while degradation of the crystal quality resulting from Si addition is suppressed as much as possible. Further, the GaN crystal of this embodiment is more advantageous compared with conventional GaN crystals containing more impurities in that the GaN crystal of this embodiment has extremely low concentrations of impurities which may cause carrier scattering, and thus can avoid a reduction in the carrier mobility.

Furthermore, similarly to the GaN crystal of the first embodiment, the GaN crystal obtained according to this embodiment has extremely low concentrations of impurities such as Fe and C, which compensate n-type conductivity, and therefore, uniformity of the carrier concentration can be enhanced when compared with conventional GaN crystals containing these impurities in larger amounts.

For example, when a GaN crystal is grown on a GaN substrate that has a +c plane as its surface and an off angle distribution, amounts of Fe, C, and the like incorporated into the GaN crystal depend on the off angle. Accordingly, in a situation where a large amount of Fe or C is incorporated into the GaN crystal, the obtained GaN crystal has a variation in the concentration of free electrons as large as several tens of percentages or more in a wafer plane. For example, in Shiojima 2019, which will be described later, when the off angle distribution in a 2-inch substrate is about 0.3°, an effective carrier concentration varies in a range from $5 \times 10^{15}$ cm$^{-3}$ to $8 \times 10^{15}$ cm$^{-3}$ in a plane. This variation corresponds to 15% or more of an average value, as a dispersion of the carrier concentration measured across the entire plane.

In contrast, in the GaN crystal of this embodiment, the concentrations of impurities such as Fe and C, which compensate n-type conductivity, are extremely low as in the GaN crystal according to the first embodiment. Therefore, even when the surface of the GaN crystal constituting the seed crystal substrate 20 has a large off angle distribution, a uniform carrier concentration distribution can be easily achieved.

Specifically, the dispersion of the carrier concentration can be made 3% or less of the average value if the average carrier concentration (average concentration of free electrons) in a plane of the substrate 10 is $1×10^{15}$ cm$^{-3}$ or more when the substrate 10 is a GaN substrate having a size of 25 mm or more (2 inches, 4 inches, or 6 inches) and an off angle distribution measured in a radial direction of the substrate 10 (the largest value of a difference between off angles measured at two points each at a distance of 80% or less of the radius from the center in the radial direction) is 0.4° or less.

Further, the GaN crystal of this embodiment is more advantageous compared with conventional GaN crystals containing more impurities in that the GaN crystal of this embodiment has extremely low concentrations of impurities which may cause carrier scattering, and thus can avoid a reduction in the carrier mobility. For example, when the concentration of electrons in the GaN crystal of this embodiment is $2×10^{11}$ cm$^{-3}$ or less, a mobility as high as 1500 cm$^2$/Vs or more is achieved at room temperature.

It has also been confirmed that similar effects can be obtained using Ge alternative to or in addition to Si as an n-type dopant. In these cases, the total concentration of Si and Ge in the crystal is $1×10^{15}$ cm$^{-3}$ or more, for example, and preferably $5×10^{19}$ cm$^{-3}$ or less.

Variation of the Second Embodiment of the Present Invention

In the second embodiment described above, the amount of the Si-containing gas supplied in the crystal growth step may be further reduced to make the concentration of free electrons $1×10^{14}$ cm$^{-3}$ or more and less than $1×10^{15}$ cm$^{-3}$. In this case, however, the Si concentration in the crystal cannot be measured. Only what can be said at present is that the Si concentration is less than $1×10^{15}$ cm$^{-3}$. Ge may be used alternative to or in addition to Si as an n-type dopant.

Third Embodiment of the Present Invention

Next, a third embodiment of the present invention will be described mainly on the difference from the first embodiment.

A GaN crystal of this embodiment is similar to the GaN crystal of the first embodiment in that both the concentration of C and the concentration of the electron trap E3 are extremely low, but differs from the GaN crystal of the first embodiment in that the GaN crystal of this embodiment further contains Mg and the concentration of Mg is $3×10^{18}$ cm$^{-3}$ or more. Since the GaN crystal of this embodiment contains Mg at such a concentration, it has conductive property, i.e., a resistivity of less than $1×10^2$ 2 cm under the temperature condition of 20° C. or more and 300° C. or less, and functions as a so-called p-type semiconductor crystal. For example, the concentration of Mg may be $1×10^{17}$ cm$^{-3}$ or more and $5×10^{20}$ cm$^{-3}$ or less. In this case, the concentration of holes (p-type carriers) is, for example, $5×10^{15}$ cm$^{-3}$ or more and $5×10^{18}$ cm$^{-3}$ or less under the temperature condition of 20° C. or more and 300° C. or less, and the resistivity under the same temperature condition is, for example, 0.5 Ωcm or more and 100 Ωcm or less.

A Mg-containing gas such as Cp$_2$Mg gas may be supplied along with the source gas (GaCl gas+NH$_3$ gas) to the seed crystal substrate 20 to add Mg into the GaN crystal, in the above-described crystal growth step. A partial pressure ratio of the Mg-containing gas to the group-III source gas in the reaction vessel 203 (partial pressure of the Mg-containing gas/total partial pressure of GaCl gas) may be, for example, $1/10^5$ to $1/10^2$. Further, in order to add Mg into the GaN crystal, a gas containing magnesium nitride (Mg$_3$N$_2$) or metallic Mg may be used in place of Cp$_2$Mg gas or the like. Regarding these gases, for example, Mg$_3$N$_2$ or metallic Mg may be placed in a high temperature region at about 800° C. in the middle of the gas supply pipe 232c to generate vapor of these materials. Alternatively, the substrate 10 may be obtained in the same manner as in the first embodiment and thereafter Mg ions may be implanted to this substrate 10 to add Mg into the GaN crystal. As in the second embodiment, use of a dopant gas is advantageous in that Mg can be added uniformly across the entire region in the thickness direction of the GaN crystal, and further, in that it becomes easier to avoid damage inflicted on the surface of the crystal attributable to the ion implantation. Use of ion implantation is also advantageous in that it becomes easier to avoid incorporation of the C component included in Cp$_2$Mg gas, that is, an increase in the concentration of C in the GaN crystal.

Since each of the concentrations of Si, B, Fe, O, and C in the GaN crystal obtained according to this embodiment is extremely low as in the GaN crystal obtained according to the first embodiment, the GaN crystal of this embodiment has a better quality compared with conventional GaN crystals containing these impurities in larger amounts. According to this embodiment, since the concentrations of impurities such as Si and O in the GaN crystal are low as described above, a desired conductive property (p-type semiconductor property) can be imparted to the GaN crystal even when an amount of Mg to be added is suppressed. Namely, the GaN crystal of this embodiment is more advantageous compared with conventional GaN crystals containing more impurities such as Si or O in that a desired semiconductor property can be imparted while degradation of the crystal quality resulting from Mg addition is suppressed as much as possible. Further, the GaN crystal of this embodiment is more advantageous compared with conventional GaN crystals containing more impurities in that the GaN crystal of this embodiment has extremely low concentrations of impurities which may cause carrier scattering, and thus can avoid a reduction in the carrier mobility. For example, when the concentration of holes in the GaN crystal of this embodiment is $1×10^{18}$ cm$^{-3}$, a mobility as high as 20 cm$^2$/Vs or more is achieved at room temperature.

Fourth Embodiment of the Present Invention

Next, a fourth embodiment of the present invention will be described mainly on the difference from the first embodiment.

A GaN crystal of this embodiment differs from the GaN crystal of the first embodiment in that the GaN crystal of this embodiment constitutes at least a crystal layer 40 of a semiconductor laminate 1, rather than being configured as the substrate 10.

Figure 7:
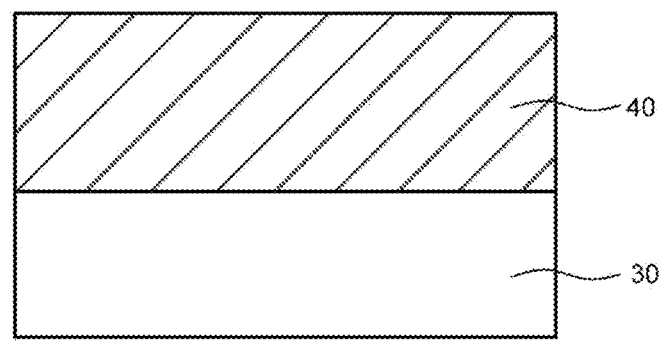
FIG. 7 is a schematic cross-sectional view of a semiconductor laminate according to a fourth embodiment of the present invention.

FIG. 7 is a schematic cross-sectional view showing a semiconductor laminate according to this embodiment.

As shown in FIG. 7, the semiconductor laminate 1 according to this embodiment includes a substrate 30 and the crystal layer 40, for example.

The substrate 30 is configured as a base substrate for epitaxially growing the crystal layer 40.

Examples of the substrate 30 include a sapphire substrate, a SiC substrate, and a nitride crystal substrate. When the substrate 30 is a nitride crystal substrate, the substrate 30 may be constituted by the GaN crystal according to any one of the first to third embodiments.

The crystal layer 40 is provided on the substrate 30 and is constituted by the GaN crystal according to any one of the first to third embodiments. Namely, the concentration of C in the crystal constituting the crystal layer 40 is less than $1 \times 10^{15}$ cm$^{-3}$, and the concentration of the electron trap E3 in the crystal is less than $1 \times 10^{14}$ cm$^{-3}$. Also, the crystal constating the crystal layer 40 satisfies the above Expression (1-1): $[E3]<1 \times 10^{14}$, while satisfying the Expression (1-2): $[E3]\cdot[C] \leq 1 \times 10^{43}$.

For example, various semiconductor devices can be manufactured by combining and layering (joining) any of the semi-insulating crystal described in the first embodiment, the n-type crystal described in the second embodiment, and the p-type crystal described in the third embodiment.

For example, in a semiconductor laminate 1 for manufacturing a p-n junction diode, the substrate 30 is constituted by an n-type GaN crystal according to the second embodiment, for example, and the crystal layer 40 is constituted by a p-type GaN crystal according to the third embodiment, for example.

For example, in a semiconductor laminate 1 for manufacturing a Schottky barrier diode, the substrate 30 is constituted by an n-type GaN crystal having a high carrier concentration according to the second embodiment, for example, and the crystal layer 40 is constituted by an n-type GaN crystal having a low carrier concentration according to the second embodiment, for example.

For example, in a semiconductor laminate 1 for manufacturing a high electron mobility transistor (HEMT), the substrate 30 is constituted by a semi-insulating SiC substrate or a substrate constituted by a semi-insulating GaN crystal according to the first embodiment, for example, and the crystal layer 40 is constituted by, for example, an electron transit layer constituted by a GaN crystal according to the first embodiment and an electron supply layer constituted by an aluminum gallium nitride (AlGaN) crystal manufactured in the same manner as in the first embodiment.

When forming a p-type GaN crystal or an n-type GaN crystal, Si or Mg may be added into the crystal by using a doping gas, or Si ions or Mg ions may be implanted to a semi-insulating GaN crystal as described above.

Also, a nucleus generating layer (not shown) may be provided between the substrate 10 and the crystal layer 40, for example. The nucleus generating layer may be constituted by aluminum nitride (AlN), for example.

According to this embodiment, the crystal layer 40 is constituted by a high-quality GaN crystal according to any one of the above embodiments, and therefore, characteristics of a semiconductor device obtained from the semiconductor laminate 1 can be improved.

Other embodiments of the present invention The embodiments of the present invention have been specifically described.

However, the present invention is not construed to be limited to the above-described embodiments, and various changes may be made without departing from the gist of the invention.

(a) The present invention can be suitably applied to growth of not only GaN, but also, for example, a group-III nitride crystal such as aluminum nitride (AlN), aluminum gallium nitride (AlGaN), indium nitride (InN), indium gallium nitride (InGaN), or aluminum indium gallium nitride (AlInGaN), that is, a crystal represented by the composition formula of $In_xAl_yGa_{1-x-y}N$ (satisfying $0 \leq x \leq 1$, $0 \leq y \leq 1$, $0 \leq x+y \leq 1$).

(b) In the above-described embodiments, ICTS is described as the method for measuring the concentration of the electron trap E3 or the like, but the method for measuring electron traps is not limited to ICTS, and may be another method so long as the electron traps can be measured.

(c) In the above-described embodiments, a method of obtaining a free-standing substrate 10 by slicing a crystal ingot that has been grown to be thick on the seed crystal substrate 20 constituted by a GaN single crystal is described, but there is no limitation to this method. For example, the substrate 10 may be manufactured using a so-called VAS (Void-Assisted Separation) method. Namely, the substrate 10 may be obtained by forming a GaN layer as a base layer on a different type of substrate as described in Document 2, separating the GaN layer that has grown to be thick via a nano mask made of titanium nitride (TiN) or the like, from the different substrate, and removing the crystal that has grown in a facet state on the different substrate side.

(d) The crystal growth step of the present invention may be performed not only by using the method described in the above embodiment but also by further combining the following methods.

For example, stay (contact) time of HCl gas on the Ga melt may be extended (e.g., to 1 minute or more) by optimizing dimensions and the shape of the gas generator to further reduce the concentration of impurities contained in GaCi gas. Alternatively, for example, a nano mask, which includes many micropores having the ability to capture impurities formed therein and is made of TiN or the like, may be formed on the seed crystal substrate, and the GaN crystal may be grown thereon. Alternatively, for example, a period of growth in a facet other than the c-plane, during which impurities are easily incorporated, may be shortened when causing the crystal growth to progress on the seed crystal substrate. When facet growth is conducted on the seed crystal substrate as described above, it is preferable to obtain the substrate 10 by growing a GaN layer to be thick, separating the resultant GaN layer from the seed crystal substrate, and removing the crystal that has grown in a facet state on the different substrate side.

According to the methods described in the first to third embodiments, such methods by themselves can significantly reduce concentrations of impurities in the GaN crystal as described above. In addition, the concentrations of impurities in the crystal can be more reliably reduced by using the methods in combination with any of the auxiliary methods described herein. However, if the high temperature baking step is not conducted, various effects described in the above embodiments cannot be attained by merely using a combination of these auxiliary methods.

(e) In the above-described embodiment, a GaN crystal is grown using the HVPE apparatus 200, but there is no limitation to such a case, and an MOCVD apparatus may be used. That is, a GaN crystal may be grown by using, as the MOCVD apparatus, an apparatus in which at least a portion of surfaces of members forming a high-temperature reaction region includes the protective layer made of an iron cyano complex, and by performing the high temperature baking step described above.

Examples

The following describes experimental results that support the effects of the above-described embodiments.

(1) GaN Crystal Substrate Samples

GaN crystal substrates of samples A1 to A5 and B1 to B10 were each obtained by growing a GaN crystal film on a GaN seed crystal substrate that had a diameter of 3 inches and a +c plane on its surface under the following growth conditions using a HVPE apparatus. Doping of impurities will be described later.

Samples A1 to A5

Out of the samples A1 to A5, samples A3 and A4 each correspond to a substrate constituted by a GaN crystal according to the above-described embodiment.

As for the samples A1 to A5, an apparatus in which the surface of a carbon member forming a high-temperature reaction region included a protective layer made of an iron cyano complex was used as the HVPE apparatus. As for the samples A1 to A4, before the crystal growth step was performed, the high temperature baking step was performed, without an oxidation sequence for supplying $O_2$ gas being performed. At this time, the high temperature baking was performed at 1100° C., 1400° C., 1500° C., and 1600° C. for the samples A1 to A4, respectively. The pressure was set to 1 atm for all of the samples A1 to A4. The high temperature baking step was not performed for the sample A5. Next, a GaN crystal with a thickness of 5 mm was grown on the seed crystal substrate without the inside of the reaction chamber being exposed to atmospheric air. Thereafter, cylindrical grinding was performed to adjust the outer diameter of the GaN crystal and then a substrate with a thickness of 400 μm was sliced from the crystal. The substrate had a diameter of 2 inches or more.

Samples B1 to B10

The samples B1 to B10 correspond to samples 8 to 17 described in Document 4, respectively.

As for the samples B1 to B10, an apparatus in which the surface of a member forming a high-temperature reaction region included a protective layer made of SiC was used as the HVPE apparatus. As for the samples B1 to B4, the high temperature baking step was performed as in the samples A1 to A4, respectively, before the crystal growth step was performed. As for the samples B5 to B9, before the crystal growth step was performed, a high temperature baking step was performed by alternately repeating an oxidation sequence for supplying $O_2$ gas and an etching sequence. At this time, the high temperature baking was performed at 1100° C., 1400° C., 1500° C., 1550° C., and 1600° C. for the samples B5 to B9, respectively. The pressure was set to 1 atm for all of the samples B5 to B9. The high temperature baking step was not performed for the sample B10. Next, a GaN crystal with a thickness of 5 mm was grown on the seed crystal substrate without the inside of the reaction chamber being exposed to atmospheric air. Thereafter, a substrate with a thickness of 400 μm was sliced from the GaN crystal.

Doping of Impurities

First, all of the above-described samples were manufactured without being doped with impurities, and analysis for impurities was performed and conductivity was checked using SIMS, which will be described later. Concentrations of impurities shown in Tables 1 to 3 are measurement results of the samples that were not doped with impurities.

On the other hand, if a GaN crystal film has a high degree of purity without being doped with impurities, the GaN crystal film has a high resistivity. Accordingly, electrical characteristics of samples that have a high resistivity cannot be measured using ICTS or the like. Therefore, as for measurement performed using ICTS, samples were manufactured and evaluated according to conductivities of the samples as described below.

As for samples that did not have a high resistivity out of the samples that were not doped with impurities, measurement using ICTS, which will be described later, was performed in the state where the samples were not doped with impurities.

On the other hand, as for the samples A3, A4, A5, B3, B4, and B7 to B10, which had a high resistivity, out of the samples that were not doped with impurities, measurement using ICTS could not be performed. Therefore, samples were separately manufactured under the same growth conditions as those of the non-doped samples in all aspects other than that the samples were intentionally doped with Si at a concentration of $1 \times 10^{16}$ cm$^{-3}$ using a gas to impart n-type conductivity to the samples. Hereinafter, these samples will be denoted by numbers to which an apostrophe is added, and will be referred to as a "sample A3' doped with a minute amount of Si" and the like. After the samples were manufactured, measurement was performed on the samples A3', A4', A5', B3', B4', and B7' to B10' doped with the minute amount of Si, by using ICTS, which will be described later.

Here, it is thought that, although the samples A3', A4', A5', B3', B4', and B7' to B10' were doped with the minute amount of Si using a Si-containing gas (SiH$_2$Cl$_2$ gas), Fe was hardly incorporated into the GaN crystal from the Si-containing gas. As described above, the origin of E3 is considered to be Fe, and accordingly, it is thought that the concentration of the electron trap does not differ between a non-doped sample and a sample doped with the minute amount of Si if these samples are grown under the same growth conditions except for the Si doping.

Accordingly, measurement results of the samples A3', A4', A5', B3', B4', and B7' to B10' doped with the minute amount of Si are shown in columns of the samples A3, A4, A5, B3, B4, and B7 to B10, respectively, in Tables 1 to 3.

(2) Evaluation

The GaN crystal substrates of the above-described samples were evaluated as follows.

SIMS

Concentrations of Si, B, and Fe in each crystal was measured through analysis for depth profile using SIMS.

Also, concentrations of O and C in each crystal were measured using SIMS in which the raster change method was used.

ICTS Method

As described above, measurement using ICTS was performed according to conductivities of the samples that were not doped with impurities. Namely, the samples A1, A2, B1, B2, B5, and B6 that had a low resistivity were measured as they were using ICTS. On the other hand, as for the samples A3, A4, A5, B3, B4, and B7 to B10 that had a high resistivity, measurement using ICTS was performed on the samples A3', A4', A5', B3', B4', and B7' to B10' doped with the minute amount of Si, and the measurement results were evaluated as results of the samples A3, A4, A5, B3, B4, and B7 to B10.

As a result, the concentration of the electron trap E3 existed in the energy range from 0.5 eV to 0.65 eV from the lower end of the conduction band, the concentration of the electron trap E1 existed in the energy range from 0.15 eV to 0.3 eV from the lower end of the conduction band, and the concentration of the electron trap Ex existed in the energy range from 0.68 eV to 0.75 eV from the lower end of the conduction band were measured in each crystal.

In the measurement performed using ICTS, the measurement temperature was adjusted within a range from 80 K to 350 K such that the time constant of thermionic emission of a target trap fell in a measurable time range (0.01 seconds to 1000 seconds). For example, the measurement temperature was set to room temperature (300 K) when the electron traps E3 and Ex shown in FIG. 3 were measured. On the other hand, the measurement temperature was set to a temperature that is 100 K or more and 150 K or less when the electron trap E1 that is at an energy position close to the conduction band was measured. Also, in the measurement performed using ICTS, the reverse bias was set to −2 V and the filling pulse was set to 100 msec at 0 V.

In the measurement performed using ICTS, an ohmic electrode constituted by Ti/Al was provided on the rear surface side of each sample, and a Schottky electrode constituted by Ni/Au was provided on the front surface side of each sample.

(3) Results

Evaluation results of the GaN crystal substrates of the samples A1 to A5 and B1 to B10 are shown in Tables 1 to 3 below. In the tables, "lower limit" means a detection lower limit in each evaluation, and results that were lower than the detection lower limit are denoted by "DL".

TABLE 1

| | | | Sample A1 | Sample A2 | Sample A3 | Sample A4 | Sample A5 |
|---|---|---|---|---|---|---|---|
| Protective layer in high-temperature reaction region | | | Iron cyano complex | Iron cyano complex | Iron cyano complex | Iron cyano complex | Iron cyano complex |
| Coating thickness (μm) | | | 50 | 50 | 50 | 50 | 50 |
| High temperature baking temperature | | | 1100 C. | 1400° C. | 1500° C. | 1600° C. | Not performed |
| Oxidation sequence | | | Not performed | Not performed | Not performed | Not performed | — |
| Depth profile | Si concentration ($cm^{-3}$) | (lower limit) $1 \times 10^{15}$ | $1.0 \times 10^{16}$ | $1.2 \times 10^{15}$ | DL | DL | DL |
| Depth profile | B concentration ($cm^{-3}$) | (lower limit) $1 \times 10^{15}$ | DL | DL | DL | DL | $1.0 \times 10^{16}$ |
| Depth profile | Fe concentration ($cm^{-3}$) | (lower limit) $1 \times 10^{15}$ | DL | DL | DL | DL | DL |
| Raster change method | O concentration ($cm^{-3}$) | (lower limit) $5 \times 10^{14}$ | $2.3 \times 10^{16}$ | $2.0 \times 10^{16}$ | $6.0 \times 10^{14}$ | DL | $5.0 \times 10^{15}$ |
| Raster change method | C concentration ($cm^{-3}$) | (lower limit) $1 \times 10^{14}$ | $1.0 \times 10^{16}$ | $6.0 \times 10^{14}$ | $2.2 \times 10^{14}$ | $1.1 \times 10^{14}$ | $4.0 \times 10^{15}$ |
| ICTS | E1 concentration ($cm^{-3}$) | (lower limit) $1 \times 10^{12}$ | $1.2 \times 10^{13}$ | $5.0 \times 10^{12}$ | $2.8 \times 10^{12}$ | $2.5 \times 10^{12}$ | $2.0 \times 10^{13}$ |
| ICTS | E3 concentration ($cm^{-3}$) | (lower limit) $1 \times 10^{12}$ | $6.0 \times 10^{13}$ | $4.0 \times 10^{13}$ | $2.0 \times 10^{13}$ | $1.8 \times 10^{13}$ | $3.0 \times 10^{14}$ |
| ICTS | Ex concentration ($cm^{-3}$) | (lower limit) $1 \times 10^{12}$ | $2.0 \times 10^{13}$ | $1.0 \times 10^{13}$ | $2.2 \times 10^{13}$ | $2.5 \times 10^{13}$ | $2.0 \times 10^{14}$ |

TABLE 2

| | | | Sample B1 Sample 8 | Sample B2 Sample 9 | Sample B3 Sample 10 | Sample B4 Sample 11 |
|---|---|---|---|---|---|---|
| No. in Patent Document 4 | | | | | | |
| Protective layer in high-temperature reaction region | | | SiC | SiC | SiC | SiC |
| High temperature baking temperature | | | 1100° C. | 1400° C. | 1500° C. | 1600° C. |
| Oxidation sequence | | | Not performed | Not performed | Not performed | Not performed |
| Depth profile | Si concentration ($cm^{-3}$) | (lower limit) $1 \times 10^{15}$ | $2.0 \times 10^{17}$ | $2.0 \times 10^{15}$ | DL | DL |
| Depth profile | B concentration ($cm^{-3}$) | (lower limit) $1 \times 10^{15}$ | DL | DL | DL | DL |
| Depth profile | Fe concentration ($cm^{-3}$) | (lower limit) $1 \times 10^{15}$ | DL | DL | DL | DL |
| Raster change method | O concentration ($cm^{-3}$) | (lower limit) $5 \times 10^{14}$ | $5.0 \times 10^{16}$ | $1.0 \times 10^{16}$ | $4.5 \times 10^{15}$ | $3.0 \times 10^{15}$ |
| Raster change method | C concentration ($cm^{-3}$) | (lower limit) $1 \times 10^{14}$ | $3.0 \times 10^{16}$ | $8.0 \times 10^{15}$ | $3.5 \times 10^{15}$ | $2.0 \times 10^{15}$ |
| ICTS | E1 concentration ($cm^{-3}$) | (lower limit) $1 \times 10^{12}$ | $1.0 \times 10^{14}$ | $2.3 \times 10^{13}$ | $5.0 \times 10^{13}$ | $8.0 \times 10^{13}$ |
| ICTS | E3 concentration ($cm^{-3}$) | (lower limit) $1 \times 10^{12}$ | $5.0 \times 10^{14}$ | $4.0 \times 10^{14}$ | $7.0 \times 10^{14}$ | $2.0 \times 10^{14}$ |
| ICTS | Ex concentration ($cm^{-3}$) | (lower limit) $1 \times 10^{12}$ | $2.0 \times 10^{14}$ | $3.0 \times 10^{14}$ | $5.0 \times 10^{14}$ | $1.0 \times 10^{14}$ |

TABLE 3

| | | | Sample B5 Sample 12 | Sample B6 Sample 13 | Sample B7 Sample 14 | Sample B8 Sample 15 | Sample B9 Sample 16 | Sample B10 Sample 17 |
|---|---|---|---|---|---|---|---|---|
| No. in Patent Document 4 | | | | | | | | |
| Protective layer in high-temperature reaction region | | | SiC | SiC | SiC | SiC | SiC | SiC |
| High temperature baking temperature | | | 1100° C. | 1400° C. | 1500° C. | 1550° C. | 1600° C. | Not performed |
| Oxidation sequence | | | Performed | Performed | Performed | Performed | Performed | — |
| Depth profile | Si concentration ($cm^{-3}$) | (lower limit) $1 \times 10^{15}$ | $1.5 \times 10^{17}$ | $1.5 \times 10^{15}$ | DL | DL | DL | DL |
| Depth profile | B concentration ($cm^{-3}$) | (lower limit) $1 \times 10^{15}$ | DL | DL | DL | DL | DL | $2.0 \times 10^{16}$ |
| Depth profile | Fe concentration ($cm^{-3}$) | (lower limit) $1 \times 10^{15}$ | DL | DL | DL | DL | DL | DL |
| Raster change method | O concentration ($cm^{-3}$) | (lower limit) $5 \times 10^{14}$ | $4.5 \times 10^{16}$ | $1.5 \times 10^{15}$ | $5.5 \times 10^{14}$ | DL | DL | $1.0 \times 10^{16}$ |
| Raster change method | C concentration ($cm^{-3}$) | (lower limit) $1 \times 10^{14}$ | $3.0 \times 10^{16}$ | $7.0 \times 10^{14}$ | $2.5 \times 10^{14}$ | $1.5 \times 10^{14}$ | DL | $1.0 \times 10^{16}$ |
| ICTS | E1 concentration ($cm^{-3}$) | (lower limit) $1 \times 10^{12}$ | $4.0 \times 10^{13}$ | $7.0 \times 10^{13}$ | $2.0 \times 10^{13}$ | $6.0 \times 10^{13}$ | $3.0 \times 10^{13}$ | $1.0 \times 10^{14}$ |
| ICTS | E3 concentration ($cm^{-3}$) | (lower limit) $1 \times 10^{12}$ | $4.0 \times 10^{14}$ | $5.0 \times 10^{14}$ | $4.0 \times 10^{14}$ | $3.0 \times 10^{14}$ | $2.2 \times 10^{14}$ | $7.0 \times 10^{14}$ |
| ICTS | Ex concentration ($cm^{-3}$) | (lower limit) $1 \times 10^{12}$ | $5.0 \times 10^{14}$ | $3.0 \times 10^{14}$ | $2.0 \times 10^{14}$ | $5.0 \times 10^{14}$ | $6.0 \times 10^{14}$ | $8.0 \times 10^{14}$ |

Samples B1 to B10

In the samples B1 to B10, the protective layer on the surface of the high-temperature reaction region was constituted by SiC as described above. Out of these samples, the sample B10 for which the high temperature baking step was not performed, the samples B1 to B4 for which the oxidation sequence in the high temperature baking step was not performed, and the samples B5 and B6 for which the oxidation sequence was performed but the high temperature baking was performed at a temperature lower than 1500° C. had high concentrations of O and C.

Also, the sample B10 for which the high temperature baking step was not performed had a high concentration of B. Also, the samples B1, B2, B5, and B6 for which the high temperature baking was performed at a temperature lower than 1500° C. had high concentrations of Si.

On the other hand, in the samples B7 to B9 for which the high temperature baking step including the oxidation sequence was performed by setting the temperature of the high temperature baking to 1500° C. or more, concentrations of Si, B, O, and C were lower than the detection lower limit, i.e., less than $1 \times 10^{15}$ cm$^{-3}$.

In all of the samples B1 to B10, the concentrations of Fe measured through analysis for depth profile using SIMS were lower than the detection lower limit.

However, when the measurement was performed using ICTS on the samples B1 to B10 in this experiment, concentrations of the electron trap E3 in the samples B1 to B10 were $2.0 \times 10^{14}$ cm$^{-3}$ or more. Since the origin of the electron trap E3 is considered to be Fe, it was found based on the concentrations of E3 that the concentrations of Fe in the samples B1 to B10 were $2.0 \times 10^{14}$ cm$^{-3}$ or more.

In addition, the concentration of the electron trap E1 was $2 \times 10^{13}$ cm$^{-3}$ or more and the concentration of the electron trap Ex was $1 \times 10^{14}$ cm$^{-3}$ or more in the samples B1 to B10.

As for the samples B1 to B10, the protective layer in the high-temperature reaction region was constituted by SiC, and therefore, the protective layer became fragile at the growth temperature of the GaN crystal and in the atmosphere of the source gas. It is thought that, consequently, a minute amount of Fe leaked as an impurity from a carbon member or the like forming the high-temperature reaction region. It is thought that, therefore, the concentration of the electron trap E3 could not be reduced. Also, it is thought that the electron trap E1 or Ex was generated in the crystal because the crystal quality of the GaN crystal was slightly degraded due to such an impurity. It is also conceivable that the electron traps E1 and Ex were introduced into the crystal because impurities other than Fe were generated from the carbon member.

As a result, it was not possible to reduce both the concentration of C and the concentration of the electron trap E3, which are in a trade-off relationship with each other, in the samples B1 to B10 based on the technology described in Document 4.

Samples A1 to A5

As for the samples A1 to A5, the protective layer on the surface of the high-temperature reaction region was constituted by an iron cyano complex as described above. Out of these samples, the sample A5 for which the high temperature baking step was not performed and the samples A1 and A2 for which the high temperature baking was performed at a temperature lower than 1500° C. had high concentrations of O and C.

Also, the sample A5 for which the high temperature baking step was not performed had a high concentration of B. Also, the samples A1 and A2 for which the high temperature baking was performed at a temperature lower than 1500° C. had high concentrations of Si.

On the other hand, in the samples A3 and A4 for which the protective layer on the surface of the high-temperature reaction region was constituted by an iron cyano complex and the high temperature baking step was performed at a temperature higher than or equal to 1500° C. without the oxidation sequence being performed, concentrations of Si and B were lower than the detection lower limit, i.e., less than $1 \times 10^{15}$ cm$^3$, and concentrations of O and C were also less than $1 \times 10^5$ cm$^{-3}$. In particular, in the sample A4 for which the high temperature baking step was performed at 1600° C., the concentration O was lower than the lower limit of the raster change method, i.e., less than $5 \times_{10} H$ cm$^{-3}$, and the concentration of C was $1.1 \times 10^{14}$ cm$^3$, which is close to the lower limit of the raster method.

Furthermore, in the samples A3' and A4' doped with the minute amount of Si, the concentrations of the electron trap E3 in the crystals measured using ICTS were less than $1 \times 10^{14}$ cm$^{-3}$. In particular, in the sample A4' doped with the minute amount of Si, the concentration of the electron trap E3 was less than $2 \times 10^{13}$ cm$^{-3}$.

It was thought that, in this experiment, the origin of Fe that generated the electron trap E3 was the carbon member in the high-temperature reaction region. However, the generation of Fe from the carbon member in the high-temperature reaction region was suppressed by the iron cyano complex coating in the samples A3 and A4. In this respect, it is thought that the generation of Fe would be suppressed irrespective of whether the samples were doped with Si or not.

Namely, since the concentration of the electron trap E3 was reduced in the samples A3' and A4' doped with the minute amount of Si, as a matter of course, the concentration of the electron trap E3 should have been reduced in the samples A3 and A4, which were manufactured under the same conditions as the samples A3' and A4' in all aspects other than that the samples A3 and A4 were not doped with Si, and moreover, it is conceivable that the concentration of the electron trap E3 was further reduced in the samples A3 and A4 than in the samples A3' and A4' doped with the minute amount of Si.

For the above reason, it was confirmed that the concentrations of the electron trap E3 in the samples A3 and A4 were less than $1 \times 10^{14}$ cm$^{-3}$ based on the results of the concentrations of the electron trap E3 in the samples A3' and A4' doped with the minute amount of Si. Furthermore, it was confirmed that the concentrations of the electron trap E3 in the samples A3 and A4 were less than $2 \times 10^{13}$ cm$^3$.

Also, since the origin of E3 is considered to be Fe, based on the concentrations of E3, it was confirmed that the concentrations of Fe in the samples A3 and A4 were less than $1 \times 10^{14}$ cm$^{-3}$.

Also, based on the results of the concentrations of the electron traps E1 and Ex in the samples A3' and A4' doped with the minute amount of Si, it was confirmed that the concentrations of the electron trap E1 in the samples A3 and A4 were $3 \times 10^{11}$ cm-3 or less, and the concentrations of the electron trap Ex in the samples A3 and A4 were $3 \times 10^{13}$ cm$^3$ or less.

As described above, it was confirmed that both the concentration of C and the concentration of the electron trap E3, which were reported as being in a trade-off relationship with each other, were significantly reduced in the samples A3 and A4.

Figure 8:
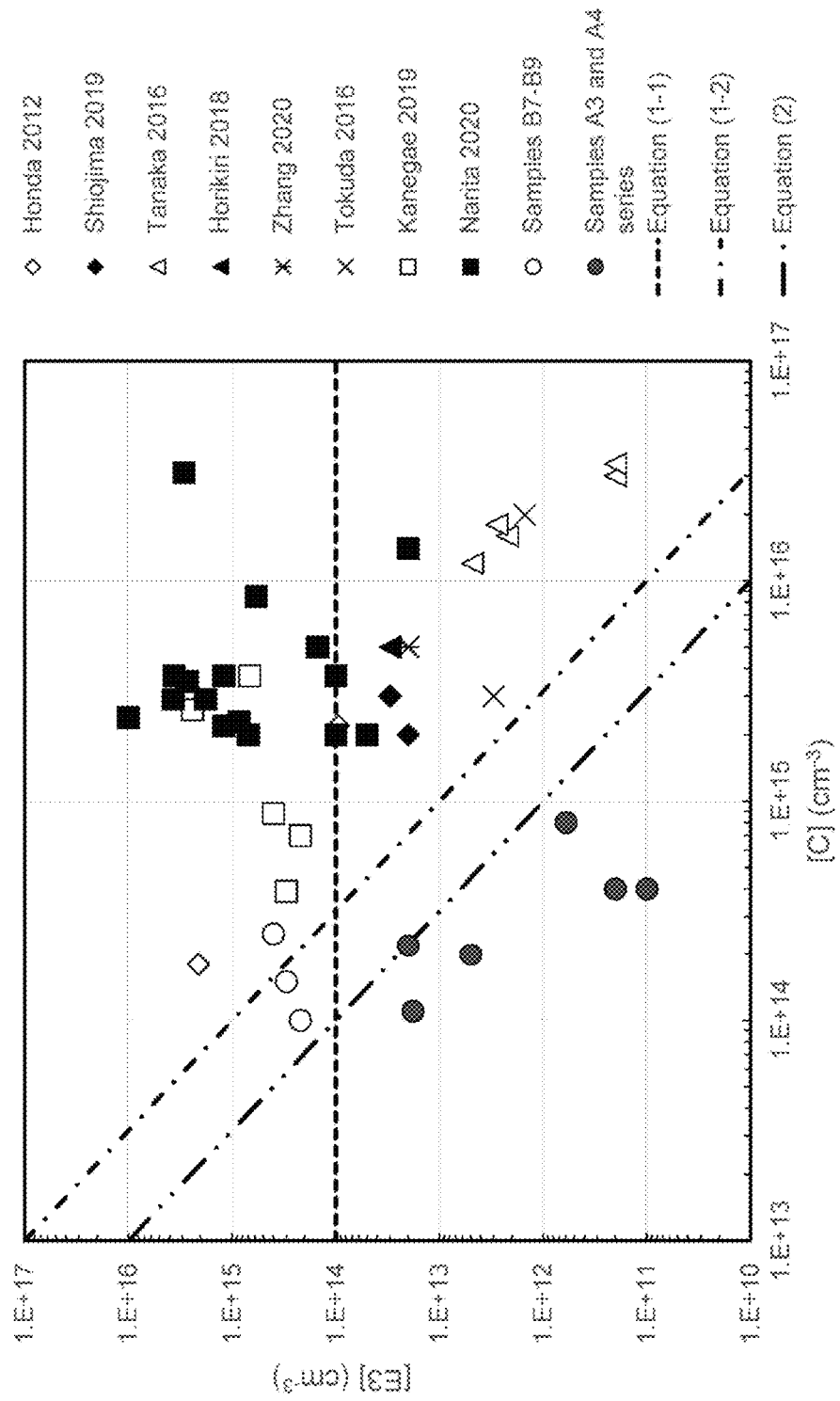
FIG. 8 is a diagram showing a relationship between the concentration of carbon and the concentration of an electron trap E3.

Here, a relationship between the concentration of C and the concentration of the electron trap E3 in the samples A3 and A4 will be described with reference to FIG. 8. FIG. 8 is a diagram showing a relationship between the concentration of carbon and the concentration of the electron trap E3. "pE+q" shown on each axis in FIG. 8 means "p×10$^q$".

In FIG. 8, "samples A3 and A4 series" denotes results of the samples A3 and A4, which were determined based on the samples A3' and A4' doped with the minute amount of Si, as well as samples that were manufactured by varying the growth conditions of the samples A3 and A4 within ranges in which the requirements of the above-described embodiments were satisfied.

Also, data of papers and patent documents are shown in FIG. 8 as data of conventional technologies.

[Honda 2012]
  Honda, Shiojima JJAP 51 (2012) 04DF04
[Shiojima 2019]
  Shiojima et al., Phys. Status Solidi B 2019, 1900561
[Tanaka 2016]
  T. Tanaka, K. Shiojima, T. Mishima, Y. Tokuda, Jpn. J. Appl. Phys. 55, 061101 (2016)
[Horikiri 2018]
  JP 2020-35980A
[Zhang 2020]
  Zhang et al., J. Appl. Phys. 127, 215707 (2020)
[Tokuda 2016]
  Yutaka Tokuda, ECS Transactions, 75 (4) 39-49 (2016)
[Kanegae 2019]
  Kanegae et al., Appl. Phys. Lett. 115, 012103 (2019)
[Narita 2020]
  Narita et al., Jpn. J. Appl. Phys. 59, 105505 (2020)

In FIG. 8, "Equation (1-1)", "Equation (1-2)", and "Equation (2)" respectively denote the following equations: [E3]=1×10$^{14}$, [E3]·[C]$^2$=1×10$^{43}$, and [E3]·[C]$^2$=1×10$^{42}$.

As shown in FIG. 8, it was reconfirmed that, in the conventional technologies, the concentration of C and the concentration of the electron trap E3 in a GaN crystal are in a trade-off relationship with each other.

Also, in the data of the conventional papers and patent documents, reductions in both of the concentration of C and the concentration of the electron trap E3 in the GaN crystal were not achieved. Namely, the data of the conventional paper and patent documents is in the state of either an expression: [E3]≥1×10$^{14}$ or an expression: [E3]·[C]$^2$>1×10$^{43}$.

On the other hand, it was confirmed that in the samples A3 and A4 and the corresponding samples, above Expression (1-1): [E3]<1×10$^{14}$ was satisfied while Expression (1-2): [E3]·[C]$^2$≤1×10$^{43}$ was satisfied, or preferably, above Expression (2): [E3]·[C]$^2$≤1×10$^{42}$ was satisfied.

Also, in the samples A3 and A4, electron traps other than E1, E3, and Ex did not exist in the temperature range in which the ICTS measurement was performed, i.e., from 80 K to 350 K, and accordingly, it was confirmed that the total concentration of electron traps existing in an energy range from 0.1 eV to 1.0 eV from the lower end of the conduction band was less than 1×10$^{14}$ cm$^{-3}$.

As described above, it was confirmed that GaN crystals that had very high quality that could not be achieved with the conventional technologies were realized in the samples A3 and A4 satisfying the requirements of the above embodiments and the corresponding samples.

(4) Supplementary Notes

In the above-described experiment, the concentrations of the electron traps in the samples A3 and A4 were estimated based on the measurement results of the concentrations of the electron traps in the samples A3' and A4' doped with the minute amount of Si, but there is no limitation to this case.

For example, when Si ions are intentionally implanted at a concentration of 1×10$^{16}$ cm$^{-3}$ to the samples A3 and A4 having a high resistivity, measurement using ICTS can be performed directly on the samples A3 and A4.

In this case as well, it was confirmed that in the samples A3 and A4 to which the minute amount of Si ions was implanted, the concentration of the electron trap E3 was less than 2×10$^{13}$ cm$^{-3}$, the concentration of the electron trap E1 was 3×10$^{12}$ cm$^3$ or less, and the concentration of the electron trap Ex was 3×10$^3$ cm$^{-3}$ or less.

Preferred Aspects of the Present Invention

The following are supplementary notes about preferred aspects of the present invention.

Supplementary Note 1

A nitride crystal represented by a composition formula In$_x$Al$_y$Ga$_{1-x-y}$N (satisfying 0≤x≤1, 0≤y≤1, and 0≤x+y≤1), wherein the concentration of carbon in the crystal is less than 1×10$^{15}$ cm$^{-3}$, and
  the concentration of an electron trap E3 that exists in an energy range from 0.5 eV to 0.65 eV from a lower end of a conduction band in the crystal is less than 1×10$^{14}$ cm$^{-3}$.

Supplementary Note 2

The nitride crystal according to Supplementary Note 1, satisfying Expression (1-2):

$$[E3]\cdot[C]^2 \leq 1\times10^{43} \qquad (1\text{-}2),$$

where [C] represents the concentration of carbon in the crystal expressed in the unit of cm$^{-3}$, and
  [E3] represents the concentration of E3 in the crystal expressed in the unit of cm$^{-3}$.

Supplementary Note 3

A nitride crystal that is represented by a composition formula In$_x$Al$_y$Ga$_{1-x-y}$N (satisfying 0≤x≤1, 0≤y≤1, and 0≤x+y≤1) and satisfies Expressions (1-1) and (1-2):

$$[E3]<1\times10^{14} \qquad (1\text{-}1)$$

$$[E3]\cdot[C]^2 \leq 1\times10^{43} \qquad (1\text{-}2),$$

where [C] represents the concentration of carbon in the crystal expressed in the unit of cm$^{-3}$, and
  [E3] represents the concentration of an electron trap E3 that exits in an energy range from 0.5 eV to 0.65 eV from a lower end of a conduction band in the crystal, the concentration of E3 being expressed in the unit of cm$^3$.

Supplementary Note 4

The nitride crystal according to Supplementary Note 2 or 3, satisfying the following Expression (2):

$$[E3]\cdot[C]^2 \leq 1\times10^{42} \qquad (2).$$

Supplementary Note 5

The nitride crystal according to any one of Supplementary Notes 1 to 4, wherein the concentration of an electron trap E1 that exists in an energy range from 0.15 eV to 0.3 eV from the lower end of the conduction band in the crystal is 3×10$^{12}$ cm$^{-3}$ or less.

Supplementary Note 6

The nitride crystal according to any one of Supplementary Notes 1 to 5,
  wherein the concentration of an electron trap Ex that exists in an energy range from 0.68 eV to 0.75 eV from the lower end of the conduction band in the crystal is 3×10$^{13}$ cm$^{-3}$ or less.

Supplementary Note 7

The nitride crystal according to any one of Supplementary Notes 1 to 6, wherein the concentration of E3 in the crystal is less than 2×10$^{13}$ cm$^{-3}$.

Supplementary Note 8
The nitride crystal according to any one of Supplementary Notes 1 to 7, wherein the concentration of boron in the crystal is less than $1\times10^{15}$ cm$^{-3}$.

Supplementary Note 9
The nitride crystal according to any one of Supplementary Notes 1 to 8,
wherein the concentration of oxygen in the crystal is less than $1\times10^{15}$ cm$^3$.

Supplementary Note 10
The nitride crystal according to any one of Supplementary Notes 1 to 9,
wherein the total concentration of electron traps that exist in an energy range from 0.1 eV to 1.0 eV from the lower end of the conduction band in the crystal is less than $1\times10^{1'}$ cm$^{-3}$.

Supplementary Note 11
The nitride crystal according to any one of Supplementary Notes 1 to 10,
wherein the concentration of silicon in the crystal is less than $1\times10^{15}$ cm$^{-3}$.

Supplementary Note 12
The nitride crystal according to any one of Supplementary Notes 1 to 11,
wherein the resistivity of the crystal under a temperature condition of 20° C. or more and 300° C. or less is $1\times10^{6}$ Ωcm or more.

Supplementary Note 13
The nitride crystal according to Supplementary Note 12
wherein the resistivity of the crystal under the temperature condition of 20° C. or more and 300° C. or less is $1\times10^{7}$ Ωcm or more.

Supplementary Note 14 The nitride crystal according to any one of Supplementary Notes 1 to 10, wherein the total concentration of Si and Ge in the crystal is $1\times10^{15}$ cm$^3$ or more, and preferably $5\times10^{19}$ cm$^{-3}$ or less.

Supplementary Note 15
The nitride crystal according to Supplementary Note 14,
wherein the resistivity of the crystal under a temperature condition of 20° C. or more and 300° C. or less is $1\times10^{2}$ Ωcm or less, and preferably $1\times10^{-4}$ Ωcm or more, and
the concentration of free electrons under the temperature condition of 20° C. or more and 300° C. or less is preferably $1\times10^{14}$ cm$^{-3}$ or more and $5\times10^{19}$ cm$^{-3}$ or less.

Supplementary Note 16
The nitride crystal according to any one of Supplementary Notes 1 to 10,
wherein the concentration of Mg in the crystal is $1\times10^{17}$ cm$^{-3}$ or more, and preferably $5\times10^{20}$ cm$^{-3}$ or less.

Supplementary Note 17
The nitride crystal according to Supplementary Note 16,
wherein the resistivity of the crystal under a temperature condition of 20° C. or more and 300° C. or less is $1\times10^{2}$ Ωcm or less, and preferably 0.5 Ωcm or more and 100 Ωcm or less, and the concentration of holes under the temperature condition of 20° C. or more and 300° C. or less is preferably $2\times10^{17}$ cm$^{-3}$ or more and $5\times10^{18}$ cm$^{-3}$ or less.

Supplementary Note 18
A semiconductor laminate including:
a substrate; and
a nitride crystal layer that is provided on the substrate and is constituted by a crystal represented by a composition formula In$_x$Al$_y$Ga$_{1-x-y}$N (satisfying 0≤x≤1, 0≤y≤1, and 0≤x+y≤1),
wherein the concentration of carbon in the nitride crystal layer is less than $1\times10^{15}$ cm$^{-3}$, and
the concentration of an electron trap E3 that exists in an energy range from 0.5 eV to 0.65 eV from a lower end of a conduction band in the crystal is less than $1\times10^{14}$ cm$^{-3}$.

Supplementary Note 19
A semiconductor laminate including:
a substrate; and
a nitride crystal layer that is provided on the substrate and is constituted by a crystal represented by a composition formula In$_x$Al$_y$Ga$_{1-x-y}$N (satisfying 0≤x≤1, 0≤y≤1, and 0≤x+y≤1),
wherein the nitride crystal layer satisfies Expressions (1-1) and (1-2):

$$[E3]<1\times10^{14} \tag{1-1}$$

$$[E3]\cdot[C]^2 \leq 1\times10^{43} \tag{1-2},$$

where [C] represents the concentration of carbon in the nitride crystal layer expressed in the unit of cm$^{-3}$, and
[E3] represents the concentration of an electron trap E3 that exists in an energy range from 0.5 eV to 0.65 eV from a lower end of a conduction band in the crystal, the concentration of E3 being expressed in the unit of cm$^{-3}$.

Supplementary Note 20
A method for manufacturing a nitride crystal, including:
a step of preparing a reaction vessel for accommodating a substrate; and
a step of epitaxially growing a nitride crystal represented by a composition formula In$_x$Al$_y$Ga$_{1-x-y}$N (satisfying 0≤x≤1, 0≤y≤1, and 0≤x+y≤1) on the substrate by supplying a group-III element source gas and a nitrogen source gas to the substrate heated to a predetermined growth temperature in the reaction vessel,
wherein the step of preparing the reaction vessel includes:
a step of preparing, as the reaction vessel, a vessel that includes a high-temperature reaction region that is heated to the growth temperature and comes into contact with gas supplied to the substrate, and in which at least a portion of a surface of a member that forms the high-temperature reaction region includes a protective layer that is made of an iron cyano complex; and
a high temperature baking step of cleaning and modifying the surface of the member forming the high-temperature reaction region by supplying a hydrogen gas and a halogen-based gas into the reaction vessel while heating the high-temperature reaction region to a temperature of 1500° C. or more, without supplying the nitrogen source gas into the reaction vessel.

Supplementary Note 21
The method for manufacturing a nitride crystal according to Supplementary Note 20,
wherein the pressure in the reaction vessel is kept at 0.5 atm or more and 2 atm or less in the high temperature baking step,
the temperature of at least the high-temperature reaction region in the reaction vessel is preferably kept at 1500° C. or more in the high temperature baking step,
the high temperature baking step is preferably performed while exhausting the reaction vessel, and
the high temperature baking step is preferably performed for 30 minutes or more.

Supplementary Note 22

An apparatus for manufacturing a nitride crystal, including:
- a reaction vessel for accommodating a substrate;
- a heating portion configured to heat at least the substrate in the reaction vessel;
- a gas supply system configured to supply a group-III element source gas and a nitrogen source gas to the substrate in the reaction vessel; and
- a controller configured to control the heating portion and the gas supply system to supply the group-III element source gas and the nitrogen source gas to the substrate heated to a predetermined growth temperature in the reaction vessel and epitaxially grow a nitride crystal represented by a composition formula $In_xAl_yGa_{1-x-y}N$ (satisfying $0 \leq x \leq 1$, $0 \leq y \leq 1$, and $0 \leq x+y \leq 1$) on the substrate, wherein the reaction vessel includes a high-temperature reaction region that is heated to the growth temperature and comes into contact with gas supplied to the substrate, at least a portion of a surface of a member that forms the high-temperature reaction region includes a protective layer that is made of an iron cyano complex, and the controller controls to perform a high temperature baking treatment before a treatment for epitaxially growing the nitride crystal, wherein the high temperature baking treatment includes cleaning and modifying the surface of the member forming the high-temperature reaction region by supplying a hydrogen gas and a halogen-based gas into the reaction vessel while heating the high-temperature reaction region to a temperature of 1500° C. or more, without supplying the nitrogen source gas into the reaction vessel.

LIST OF REFERENCE NUMERALS

10 Substrate (nitride crystal substrate)
20 Seed crystal substrate
21 GaN crystal film
30 Substrate
40 Crystal layer (nitride crystal layer)

What is claimed is:

1. A nitride crystal that is represented by a composition formula $In_xAl_yGa_{1-x-y}N$ (satisfying $0 \leq x \leq 1$, $0 \leq y \leq 1$, and $0 \leq x+y \leq 1$),
   wherein a concentration of carbon in the nitride crystal is less than $1 \times 10^{15}$ cm$^{-3}$, and the nitride crystal satisfies Expressions (1-1) and (1-2):

$$[E3] < 1 \times 10^{14} \tag{1-1}$$

$$[E3] \cdot [C]^2 \leq 1 \times 10^{43} \tag{1-2},$$

where [C] represents the concentration of carbon in the crystal expressed in the unit of cm$^{-3}$, and
   [E3] represents the concentration of an electron trap E3 that exists in an energy range from 0.5 eV to 0.65 eV from a lower end of a conduction band in the crystal, the concentration of E3 being expressed in the unit of cm$^{-3}$.

2. The nitride crystal according to claim 1, satisfying Expression (2):

$$[E3] \cdot [C]^2 \leq 1 \times 10^{42} \tag{2}.$$

3. The nitride crystal according to claim 1,
   wherein the concentration of an electron trap E1 that exists in an energy range from 0.15 eV to 0.3 eV from the lower end of the conduction band in the crystal is $3 \times 10^{12}$ cm$^{-3}$ or less.

4. The nitride crystal according to claim 1,
   wherein the concentration of an electron trap Ex that exists in an energy range from 0.68 eV to 0.75 eV from the lower end of the conduction band in the crystal is $3 \times 10^{13}$ cm$^{-3}$ or less.

5. The nitride crystal according to claim 1,
   wherein the concentration of E3 in the crystal is less than $2 \times 10^{13}$ cm$^{-3}$.

6. The nitride crystal according to claim 1,
   wherein the concentration of boron in the crystal is less than $1 \times 10^{15}$ cm$^{-3}$.

7. The nitride crystal according to claim 1,
   wherein the concentration of oxygen in the crystal is less than $1 \times 10^{15}$ cm$^{-3}$.

8. The nitride crystal according to claim 1,
   wherein the total concentration of electron traps that exist in an energy range from 0.1 eV to 1.0 eV from the lower end of the conduction band in the crystal is less than $1 \times 10^{14}$ cm$^{-3}$.

9. A semiconductor laminate comprising:
   a substrate; and
   a nitride crystal layer that is provided on the substrate and is constituted by the nitride crystal according to claim 1.

10. A method for manufacturing a nitride crystal, comprising:
    a step of epitaxially growing the nitride crystal according to claim 1 on a substrate.

* * * * *